United States Patent
Yamamoto et al.

(10) Patent No.: US 12,436,102 B2
(45) Date of Patent: Oct. 7, 2025

(54) DETECTING DEVICE AND MEASURING DEVICE

(71) Applicant: SEIKO EPSON CORPORATION, Tokyo (JP)

(72) Inventors: Tetsuya Yamamoto, Suwa (JP); Takefumi Fukagawa, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 941 days.

(21) Appl. No.: 17/537,044

(22) Filed: Nov. 29, 2021

(65) Prior Publication Data

US 2022/0170852 A1 Jun. 2, 2022

(30) Foreign Application Priority Data

Nov. 30, 2020 (JP) .................. 2020-198132
Mar. 21, 2021 (JP) .................. 2021-059781

(51) Int. Cl.
*G01N 21/359* (2014.01)
*A61B 5/1455* (2006.01)
*A61B 5/1495* (2006.01)

(52) U.S. Cl.
CPC ......... *G01N 21/359* (2013.01); *A61B 5/1455* (2013.01); *A61B 5/1495* (2013.01)

(58) Field of Classification Search
CPC .... G01N 21/359; A61B 5/1455; A61B 5/1495
See application file for complete search history.

(56) References Cited

U.S. PATENT DOCUMENTS

| | | | |
|---|---|---|---|
| 9,506,802 B2 | 11/2016 | Chu et al. |
| 9,664,556 B2 | 5/2017 | Chu et al. |
| 9,696,199 B2 | 7/2017 | Chu et al. |
| 9,752,925 B2 | 9/2017 | Chu et al. |
| 10,088,356 B2 | 10/2018 | Chu et al. |
| 10,132,677 B2 | 11/2018 | Chu et al. |
| 10,760,955 B2 | 9/2020 | Chu et al. |

(Continued)

FOREIGN PATENT DOCUMENTS

| | | |
|---|---|---|
| JP | 2011-185634 A | 9/2011 |
| JP | 2013-063203 A | 4/2013 |

(Continued)

*Primary Examiner* — Eric F Winakur
*Assistant Examiner* — Hy Khanh Doan
(74) *Attorney, Agent, or Firm* — Oliff PLC

(57) ABSTRACT

A detecting device of the present disclosure includes a first light-emitting unit that emits first light having a green wavelength band, a second light-emitting unit that emits second light having a wavelength band higher than the green wavelength band, a first light-receiving unit that receives the first light emitted from the first light-emitting unit and emitted from a biological body, and a second light-receiving unit that receives the second light emitted from the second light-emitting unit and emitted from the biological body, in which the first light-receiving unit includes a bandpass filter that selectively transmits the first light, and a distance from the first light-emitting unit to the first light-receiving unit is shorter than a distance from the second light-emitting unit to the second light-receiving unit.

18 Claims, 9 Drawing Sheets

(56) References Cited

U.S. PATENT DOCUMENTS

| | | | |
|---|---|---|---|
| 2007/0073117 A1* | 3/2007 | Raridan, Jr. | A61B 5/6826 |
| | | | 600/323 |
| 2011/0216315 A1 | 9/2011 | Uematsu et al. | |
| 2016/0238439 A1 | 8/2016 | Chu et al. | |
| 2016/0238440 A1 | 8/2016 | Chu et al. | |
| 2016/0238441 A1 | 8/2016 | Chu et al. | |
| 2016/0238443 A1 | 8/2016 | Chu et al. | |
| 2016/0238444 A1 | 8/2016 | Chu et al. | |
| 2016/0240721 A1 | 8/2016 | Chu et al. | |
| 2017/0055861 A1* | 3/2017 | Narusawa | A61B 5/681 |
| 2017/0086690 A1 | 3/2017 | Freschl et al. | |
| 2017/0352695 A1* | 12/2017 | Tsuchiya | A61B 5/1455 |
| 2019/0101977 A1* | 4/2019 | Armstrong-Muntner | |
| | | | G06N 20/00 |
| 2019/0137332 A1 | 5/2019 | Chu et al. | |
| 2019/0223738 A1* | 7/2019 | Böscke | A61B 5/14552 |
| 2020/0237222 A1* | 7/2020 | Choi | A61B 5/02416 |
| 2021/0386308 A1* | 12/2021 | Ben Ishay | A61B 5/4872 |

FOREIGN PATENT DOCUMENTS

| | | |
|---|---|---|
| JP | 2015-188496 A | 11/2015 |
| JP | 2016-147052 A | 8/2016 |
| JP | 2017-506763 A | 3/2017 |
| JP | 2018-029870 A | 3/2018 |
| JP | 2018-061675 A | 4/2018 |
| JP | 2019-519272 A | 7/2019 |
| WO | 2014/136242 A1 | 9/2014 |
| WO | 2015/116756 | 8/2015 |

* cited by examiner

DETECTING DEVICE AND MEASURING DEVICE

The present application is based on, and claims priority from JP Application Serial Number 2020-198132, filed Nov. 30, 2020, and 2021-059781, filed Mar. 31, 2021, the disclosures of which are hereby incorporated by reference herein in its entirety.

BACKGROUND

1. Technical Field

The present disclosure relates to a detecting device and a measuring device.

2. Related Art

Various measurement technologies have been ever suggested for non-invasive measurement of biometric information such as pulse wave. There is disclosed, in JP 2018-061675 A, a technology in which, in a detecting device including a light-emitting unit that emits light to a biological body, and a light-receiving unit that receives the light emitted from the light-emitting unit and incident by being reflected by the biological body, a light-shielding member is installed between the light-emitting unit and the light-receiving unit, thereby increasing light utilization efficiency of the light-emitting unit and suppressing the occurrence of stray light at the light-receiving unit, for example.

Unfortunately, it is required for the detecting device described above to provide the light-shielding member having a thickness between a plurality of the light-receiving units, which causes an issue in that the device configuration cannot be miniaturized.

SUMMARY

According to one aspect of the present disclosure, there is provided a detecting device including a first light-emitting unit that emits first light having a green wavelength band, a second light-emitting unit that emits second light having a wavelength band higher than the wavelength band of the green wavelength band, a first light-receiving unit that receives the first light emitted from the first light-emitting unit and emitted from a biological body, and a second light-receiving unit that receives second light emitted from the second light-emitting unit and emitted from the biological body, in which the first light-receiving unit includes a bandpass filter that selectively transmits the first light, and a distance from the first light-emitting unit to the first light-receiving unit is shorter than a distance from the second light-emitting unit to the second light-receiving unit.

According to one aspect of the present disclosure, there is provided a detecting device including a first light-emitting unit that emits first light having a green wavelength band, a second light-emitting unit that emits second light having a wavelength band higher than the wavelength band of the green wavelength band, a first light-receiving unit that receives the first light emitted from the first light-emitting unit and emitted from a biological body, and a second light-receiving unit that receives second light emitted from the second light-emitting unit and emitted from the biological body, in which an angle-limiting filter provided at a light-receiving element of the first light-receiving unit, the angle-limiting filter being configured to limit an incidence angle of the first light reaching the first light-receiving unit, and a bandpass filter provided at the angle-limiting filter, the bandpass filter being configured to selectively transmit the first light, in which a distance from the first light-emitting unit to the first light-receiving unit is shorter than a distance from the second light-emitting unit to the second light-receiving unit, the second light-receiving unit being devoid of an angle-limiting filter that limits an incidence angle of the second light reaching the second light-receiving unit and a bandpass filter that selectively transmits the second light.

According to one aspect of the present disclosure, there is provided a measuring device including the detecting device of the aspect described above, and an information analysis unit that determines the biometric information from a detection signal indicating a detection result of the detecting device.

DESCRIPTION OF EXEMPLARY EMBODIMENTS

Figure 1:
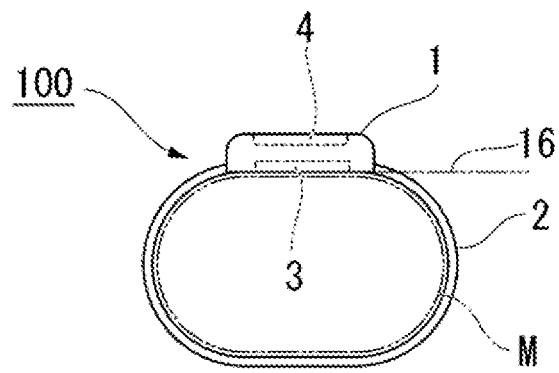
FIG. 1 is a side view of a measuring device according to the first embodiment.

Embodiments of the present disclosure will be described below with reference to the accompanying drawings. Note that, in the drawings, dimensions and angles of members are differed from actual ones to make them approximately recognizable in size.

Also, in the description of the embodiments below, common configurations and members are given identical reference signs and detailed description will be given omitting the reference signs.

First Embodiment

FIG. 1 is a side view of a measuring device 100 of the first embodiment. The measuring device 100 of the first embodiment illustrated in FIG. 1 is a biometric measuring device that non-invasively measures biometric information of an examinee (for example, a human) that is an exemplification of a biological body, and is mounted on a site to be measured (hereinafter referred to as "measurement site") M in the biological body of the examinee. The measuring device 100 of the first embodiment is a wrist-watch type portable appliance equipped with a housing portion 1 and a belt 2, and is attachable to a wrist of the examinee by winding the band shaped belt 2 around the wrist that is an exemplification of the measurement site (biological body) M. In the first embodiment, a pulse wave (for example, a pulse rate) and an oxygen saturation (SpO$_2$) are exemplified as the biometric information. The pulse wave means a time variation in volume inside a vessel that operates in conjunction with the beats of a heart. The oxygen saturation means a percentage (%) of hemoglobin bound to oxygen of the hemoglobin in the blood of the examinee, which is an indicator for assessing the respiratory function of the examinee.

Figure 2:
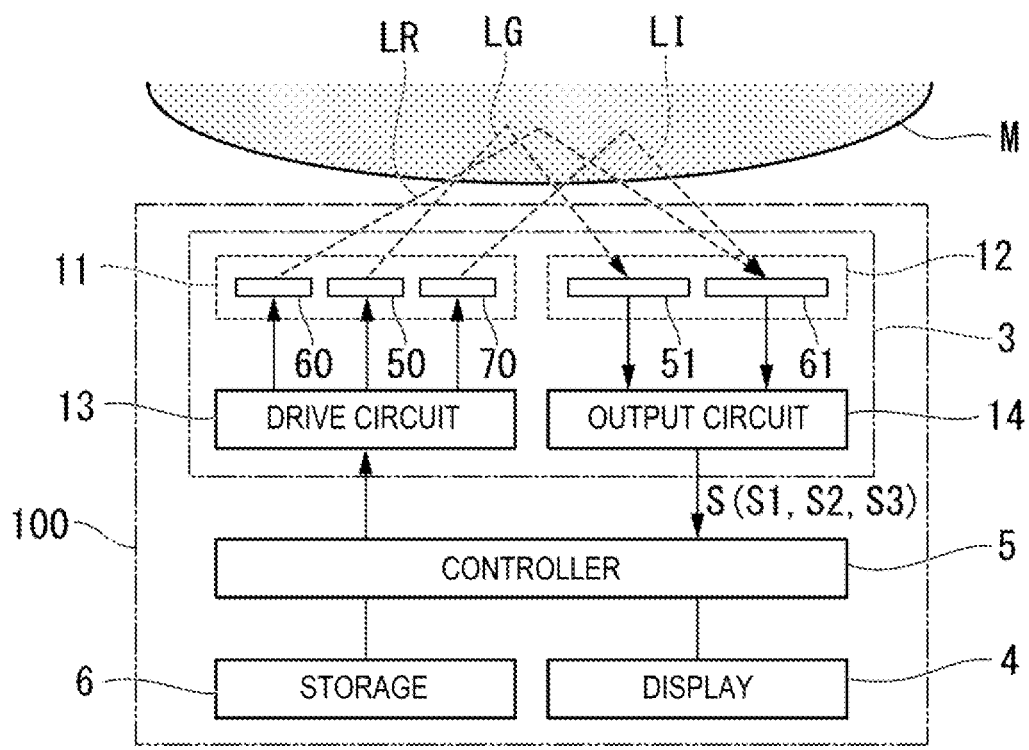
FIG. 2 is a configuration diagram focused on functions of a measuring device.

FIG. 2 is a configuration diagram focused on the functions of the measuring device 100. The measuring device 100 of the first embodiment includes a controller 5, a storage 6, a display 4, and a detecting device 3, as illustrated in FIG. 2. The controller 5 and the storage 6 are installed inside the housing portion 1. The display 4 is installed on a surface, on an opposite side from the measurement site M, of the housing portion 1, and displays various images including measurement results under a control by the controller 5, as illustrated in FIG. 1. The display 4 is a liquid crystal display panel, for example.

The detecting device 3 is an optical sensor module that generates a detection signal S depending on a state of the measurement site M. The detecting device 3 is installed at an opposite surface (hereinafter referred to as detection surface) 16, to the measurement site M, of the housing portion 1, for example, as illustrated in FIG. 1. The detection surface 16 is a surface that is in contact with the measurement site M. The detecting device 3 of the first embodiment includes a light-emitting unit portion 11, a light-receiving unit portion 12, a drive circuit 13, and a output circuit 14, as illustrated in FIG. 2. Note that one or both of the drive circuit 13 or the output circuit 14 may also be installed as an external circuit of the detecting device 3. That is, the drive circuit 13 and the output circuit 14 may be omitted from the detecting device 3.

The light-emitting unit portion 11 includes a light-emitting unit (first light-emitting unit) 50, a light-emitting unit (third light-emitting unit) 60, and a light-emitting unit (second light-emitting unit) 70. The light-emitting unit 50, the light-emitting unit 60, and the light-emitting unit 70 are light sources that each emit light of a different wavelength onto the measurement site M.

The light-emitting unit 50 emits green light (first light) LG having a green wavelength band from 520 nm to 550 nm toward the measurement site M. The green light LG of the first embodiment is light having a peak wavelength of 520 nm, for example.

The light-emitting unit 60 emits red light (third light) LR having a red wavelength band from 600 nm to 800 nm toward the measurement site M, for example. The red light LR of the first embodiment is light having a peak wavelength of 660 nm, for example.

The light-emitting unit 70 emits near-infrared light (second light) LI having a near-infrared wavelength band from 800 nm to 1300 nm toward the measurement site M, for example. The near-infrared light LI of the first embodiment is light having a peak wavelength of 905 nm, for example.

It is preferred, as light-emitting elements constituting the light-emitting unit 50, the light-emitting unit 60, and the light-emitting unit 70, to use light-emitting diodes (LEDs) of bare chip type or cannonball type, for example. Note that the wavelength of light emitted by the light-emitting units is not limited to the numerical ranges described above. When the light-emitting unit 50, the light-emitting unit 60, and the light-emitting unit 70 are not particularly distinguished, these are collectively referred to as light-emitting units 50, 60, and 70 below.

The drive circuit 13 supplies a drive current to cause each of the light-emitting units 50, 60, and 70 to emit light. The drive circuit 13 of the first embodiment causes each of the light-emitting units 50, 60, and 70 to periodically emit light in a time division manner. The light emitted from the light-emitting units 50, 60, and 70 is incident on the measurement site M and propagates while repeating reflection and scattering inside the measurement site M. Then, the light-emitting units 50, 60, and 70 are emitted to the side of the housing portion 1 to reach the light-receiving unit portion 12. That is, the detecting device 3 of the first embodiment is a reflection-type optical sensor in which the light-emitting unit portion 11 and the light-receiving unit portion 12 are located on one side with respect to the measurement site M.

The light-receiving unit portion 12 receives light coming from the measurement site M by the emission of the light-emitting unit portion 11. The light-receiving unit portion 12 of the first embodiment includes a light-receiving unit (first light-receiving unit) 51 and a light-receiving unit (second light-receiving unit) 61. The light-receiving unit 51 and the light-receiving unit 61 generate a detection signal depending on the intensity of the received light. In the following, when these are not particularly distinguished, the light-receiving unit 51 and the light-receiving unit 61 are collectively referred to as "light-receiving units 51 and 61".

The light-receiving unit 51 receives the green light LG emitted from the light-emitting unit 50 and propagated inside the measurement site M, and generates a detection signal depending on the intensity of the received light. The light-receiving unit 61 receives the red light LR emitted from the light-emitting unit 60 and propagated inside the measurement site M or the near-infrared light LI emitted from the light-emitting unit 70 and propagated inside the measurement site M, and generates a detection signal depending on the intensity of the received light.

The output circuit 14 includes an A/D converter that converts from analog to digital the detection signals generated by the light-receiving units 51 and 61, and an amplification circuit that amplifies the detection signals after the conversion (both of these are not illustrated), and generates a plurality of the detection signals S (S1, S2, and S3) corresponding to mutually different wavelengths, for example.

The detection signal S1 is a signal indicating the intensity of the green light LG emitted from the light-emitting unit 50 and received by the light-receiving unit 51. The detection signal S2 is a signal indicating the intensity of the red light LR emitted from the light-emitting unit 60 and received by the light-receiving unit 61, and the detection signal S3 is a signal indicating the intensity of the near-infrared light LI emitted from the light-emitting unit 70 and received by the light-receiving unit 61.

Due to the general variation in the light-absorption amount of blood between the expansion and contraction of a blood vessel, each of the detection signals S is a pulse signal containing a periodic fluctuation component corresponding to a pulsating component (volumetric pulse wave) of the artery inside the measurement site M.

Note that the drive circuit 13 and the output circuit 14 are mounted in the form of an IC chip on a wiring board together with the light-emitting unit portion 11 and the light-receiving unit portion 12. Note that the drive circuit 13 and the output circuit 14 may be installed on the outside of the detecting device 3, as described above.

The controller 5 is an arithmetic processing device such as a Central Processing Unit (CPU) or an FPGA (Field-Programmable Gate Array), and controls the entirety of the measuring device 100. The storage 6 is configured by a non-volatile semiconductor memory, and stores programs executed by the controller 5 and various types of data used by the controller 5, for example. Note that a configuration in which the functions of the controller 5 are distributed in a plurality of integrated circuits or a configuration in which some or all of the functions of the controller 5 are materialized by dedicated electronic circuits may also be employed. Note that the controller 5 and the storage 6 are illustrated as separate elements in FIG. 2, and it is also possible to materialize the controller 5 containing the storage 6 by an Application Specific Integrated Circuit (ASIC) and the like, for example.

The controller 5 of the first embodiment executes the programs stored in the storage 6 to identify the biometric information of the examinee from a plurality of the detection signals S (S1, S2, and S3) generated by the detecting device 3. Specifically, the controller 5 determines the pulse wave of the examinee from the detection signal S1 indicating the intensity of the green light LG received by the light-receiving unit 51. The controller 5 is configured to identify the pulse rate of the examinee based on the detection signal S1, for example. The controller 5 is also configured to identify the oxygen saturation of the examinee by analyzing the detection signal S2 indicating the intensity of the red light LR received by the light-receiving unit 61 and the detection signal S3 indicating the intensity of the near-infrared light LI received by the light-receiving unit 61.

As such, the controller 5 functions as an information analysis unit that determines the biometric information from the detection signal S indicating a detection result of the detecting device 3. The controller (information analysis unit) 5 causes the display 4 to display the biometric information identified from the detection signal S. Note that it is also possible to notify a user of the measurement result by means of audio output. A configuration is also preferred that notifies the user of a warning (a possibility of impairment of physical function) when the pulse rate or the oxygen saturation varies to a numerical value out of a predetermined range.

Figure 3:
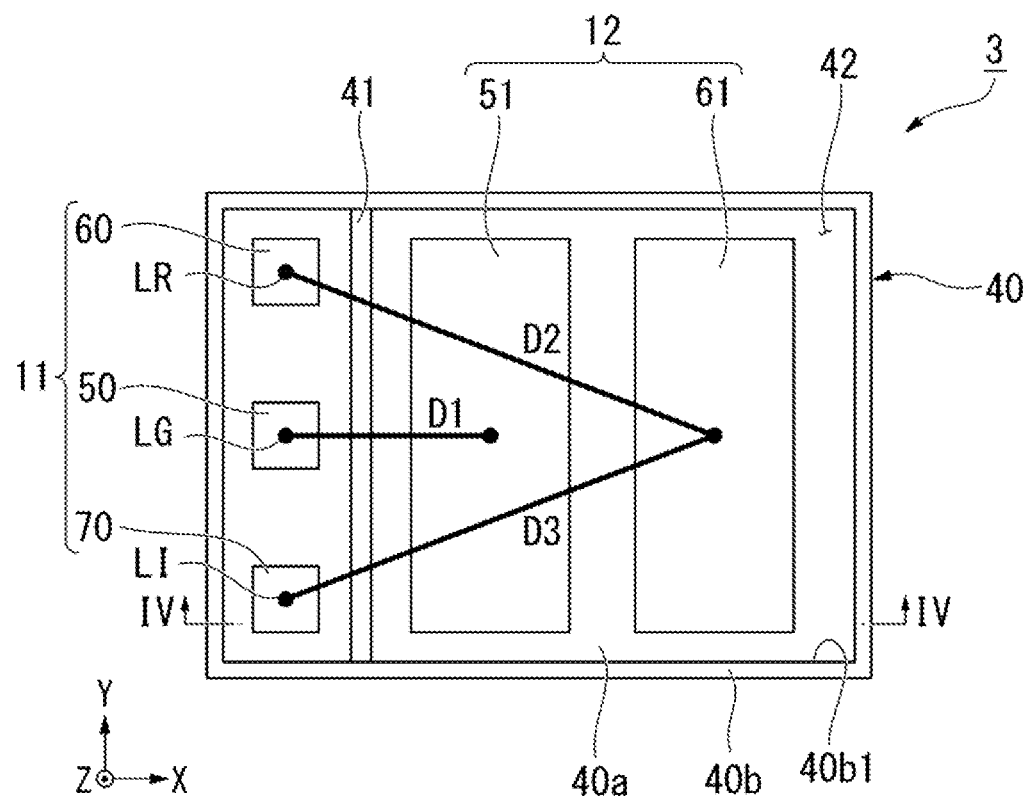
FIG. 3 is a plan view of a detecting device.
Figure 4:
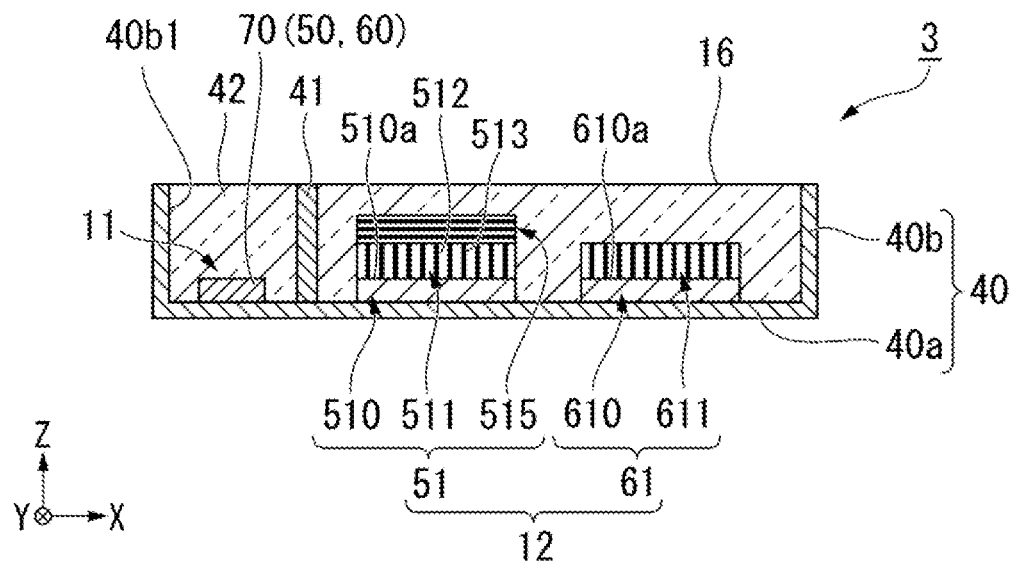
FIG. 4 is a cross-sectional view taken along a line IV-IV in FIG. 3.

FIG. 3 is a plan view of the detecting device 3. FIG. 4 is a cross-sectional view taken along the line IV-IV in FIG. 3. The detecting device 3 of the first embodiment further includes a case 40, a light-shielding wall 41, and a sealing layer 42 in addition to the light-emitting unit portion 11 and the light-receiving unit portion 12, as illustrated in FIGS. 3 and 4. Note that the drive circuit 13 and the output circuit 14 are omitted in illustration from FIGS. 3 and 4.

In the following, a configuration of the detecting device 3 will be described using an XYZ coordinate system. An X axis corresponds to an axis along a long side (one side) of the case 40 having a rectangular shape, a Y axis is orthogonal to the X axis and corresponds to an axis along a short side (the other one side) of the case 40, and a Z axis is orthogonal to each of the X axis and the Y axis and corresponds to an axis along the normal line of the detection surface 16 that is in contact with the measurement site M.

The case 40 is a member housing the elements (the light-emitting unit portion 11 and the light-receiving unit portion 12) constituting the detecting device 3, as illustrated in FIGS. 3 and 4. The case 40 has a box shape including a rectangular flat plate-shaped bottom surface portion 40a and rectangular frame-shaped side plate portions 40B protruding from the periphery of the bottom surface portion 40a to a +Z side. The case 40 is formed of aluminum, for example. An inner circumferential surface 40B1 of the side plate portion 40B is colored in black to have light-shielding properties. This suppresses reflection at the inner circumferential surface 40B1 of the side plate portion 40B.

Note that the material and manufacturing method for the case 40 are arbitrarily determined. The case 40 can also be formed by injection molding of a resin material, for example. Also, a configuration is preferred in which the case 40 is formed integrally with the housing portion 1.

The light-emitting unit portion 11 and the light-receiving unit portion 12 are mounted, in a state mounted on a wiring board (not illustrated), on the bottom surface portion 40a of the case 40. The light-shielding wall 41 is disposed, in a direction along the X axis, between the light-emitting unit portion 11 and the light-receiving unit portion 12. The light-shielding wall 41 is a plate-like member extending in a Y axis direction and protrudes from the bottom surface portion 40a to the +Z side. The light-shielding wall 41 separates, in an X axis direction, the housing space inside the case 40 into two spaces. That is, the light-shielding wall 41 is a member that isolates, in the direction along the X axis, the spaces housing the light-emitting unit portion 11 and the light-receiving unit portion 12. The light-shielding wall 41 is a member having light-shielding properties or blocking light emitted from the light-emitting unit portion 11 from directly entering the light-receiving unit portion 12.

In the first embodiment, the light-shielding wall 41 is provided, in the direction along the X axis, between the light-emitting unit portion 11 including the light-emitting unit 50, the light-emitting unit 60, and the light-emitting unit 70, and the light-receiving unit 51. The light-shielding wall 41 may also be referred to as member that blocks a part of the green light LG, the red light LR, and the near-infrared light LI.

The sealing layer 42 is a light-transmissive resin material filled into a gap between the light-emitting unit portion 11, the light-receiving unit portion 12 that are housed inside the case 40, and the side plate portion 40B. The sealing layer 42 seals (molds), inside the case 40, the light-emitting unit portion 11 and the light-receiving unit portion 12. A surface of the sealing layer 42 functions as the detection surface 16.

Note that a configuration in which a translucent substrate covers an upper surface of the side plate portion 40B of the case 40 may be employed in place of the configuration in which the sealing layer 42 seals the components. In this case, the upper surface of the translucent substrate functions as the detection surface 16.

The light-emitting unit portion 11 is installed inside the case 40 such that the light-emission surfaces of the light-emitting units 50, 60, and 70 are parallel to an XY plane. That is, the light-emitting units 50, 60, and 70 emit light toward the +Z side.

The light-emitting units 50, 60, and 70 are aligned side-by-side spaced apart from one another in a direction along the Y axis (first direction), as illustrated in FIG. 3. Specifically, the light-emitting unit 60 is disposed on the +Y side of the light-emitting unit 50, and the light-emitting unit 70 is disposed on the −Y side of the light-emitting unit 50. That is, the light-emitting unit 50 is disposed, in the direction along the Y axis, between the light-emitting unit 60 and the light-emitting unit 70. It may also be said that the light-emitting unit 50 is located between the light-emitting unit 60 and the light-emitting unit 70.

In contrast, the light-receiving unit portion 12 is installed inside the case 40 such that the light-receiving surfaces of the light-receiving units 51 and 61 are parallel to the XY plane. That is, the light-receiving units 51 and 61 are configured to receive light incident in a Z direction.

The light-receiving units 51 and 61 are aligned side-by-side spaced apart from one another in the direction (second direction) along the X axis intersecting (orthogonal to) the Y axis, as illustrated in FIG. 3. Specifically, the light-receiving unit 51 is disposed on the +X side of the light-emitting unit portion 11, and the light-receiving unit 61 is disposed on the +X side of the light-receiving unit 51. That is, the light-receiving unit 61 is disposed on an opposite side from the light-emitting unit portion 11, interposing the light-receiving unit 51 therebetween.

Here, the distance from the light-emitting unit 50 to the light-receiving unit 51 is designated as D1, the distance from the light-emitting unit 60 to the light-receiving unit 61 is designated as D2, and the distance from the light-emitting unit 70 to the light-receiving unit 61 is designated as D3. The distance D1 corresponds to the distance between the center portions of the light-emitting unit 50 and the light-receiving unit 51 when these are planarly viewed in a Z axis direction. In addition, the distance D2 corresponds to the distance between the center portions of the light-emitting unit 60 and the light-receiving unit 61 when these are planarly viewed from the Z-axis direction. Further, the distance D3 corresponds to the distance between the center portions of the light-emitting unit 70 and the light-receiving unit 61 when these are planarly viewed from the Z axis direction.

In the detecting device 3 of the first embodiment, the distance D1 from the light-emitting unit 50 to the light-receiving unit 51 is shorter than the distance D2 from the light-emitting unit 60 to the light-receiving unit 61. Also, the distance D1 from the light-emitting unit 50 to the light-receiving unit 51 is shorter than the distance D3 from the light-emitting unit 70 to the light-receiving unit 61. Note that the distance D2 is equal to the distance D3.

As such, the detecting device 3 of the first embodiment employs the configuration in which the light-receiving unit 51 for receiving the green light LG is disposed at the position closest to the light-emitting unit 50 that emits the green light LG.

The light-receiving unit 51 includes a light-receiving element (first sensor unit) 510 that receives the green light LG, an angle-limiting filter (first angle-limiting filter) 511 that limits an incidence angle of the green light LG reaching the light-receiving element 510, and a bandpass filter 515 that selectively transmits the green light LG, as illustrated in FIG. 4.

The light-receiving element 510 is constituted by a photodiode (Pd), for example. The angle-limiting filter 511 is provided on a light-receiving surface 510a of the light-receiving element 510. The angle-limiting filter 511 is formed by embedding a plug 513 composed of a light-shielding material such as tungsten into a silicon oxide layer 512 having light transmissivity, for example.

The silicon oxide layer 512 forms a light path that guides light to the light-receiving surface 510a of the light-receiving element 510. The plug 513 embedded in the silicon oxide layer 512 limits an incidence angle of light passing through the optical path (the silicon oxide layer 512). That is, when the light entering the silicon oxide layer 512 is inclined more than a predetermined angle with respect to the optical path, the incident light iremits the plug 513, where a part of the light is absorbed by the plug 513 and the rest of the light is reflected. Then, the intensity of the reflected light is weakened by repeated reflection occurring until passing through the optical path, thus the light that can eventually pass through the angle-limiting filter 511 will be substantially limited to light inclined at an angle within a predetermined limited angle with respect to the light path.

The angle-limiting filter 511 has characteristics of transmitting light incident at an angle smaller than a predetermined incidence angle, and cutting off light incident at an angle greater than the predetermined incidence angle without transmitting the light. This makes it possible to cause the angle-limiting filter 511 to limit an incidence angle of light incident on the light-receiving element 510. Specifically, the angle-limiting filter 511 transmits the green light LG incident at a predetermined incidence angle (hereinafter, referred to as permissible incidence angle) by propagating in the biological body, and cuts off light incident at an angle greater than the permissible incidence angle, the light being external light such as sunlight or light that did not enter the biological body.

The bandpass filter 515 has characteristics of selectively transmitting a wavelength band of the green light LG, and absorbing and cutting off the red light LR and the near-infrared light LI that are light in the other wavelength bands. The bandpass filter 515 is formed by alternately layering a low refractive index layer such as silicon oxide and a high refractive index layer such as titanium oxide on the angle-limiting filter 511, for example.

In contrast, the light-receiving unit 61 includes a light-receiving element (second sensor unit) 610 that receives the red light LR or the near-infrared light LI, and an angle-limiting filter (second angle-limiting filter) 611 that limits an incidence angle of the red light LR or the near-infrared light LI reaching the light-receiving element 610. That is, in the detecting device 3 of the first embodiment, the light-receiving unit 61 has a configuration different from that of the light-receiving unit 51 in that the light-receiving unit 61 does not include a bandpass filter that selectively transmits the red light LR or the near-infrared light LI.

The light-receiving element 610 is configured by a photodiode, for example. The angle-limiting filter 611 is provided on a light-receiving surface 610a of the light-receiving element 610. It is possible for the angle-limiting filter 611 having the same configuration as the angle-limiting filter 511 to limit an incidence angle of the red light LR or the near-infrared light LI reaching the light-receiving element 610. The angle-limiting filter 611 transmits the red light LR or the near-infrared light LI entering at the permissible incidence angle by propagating in the biological body, and cuts off light incident at an angle greater than the permissible incidence angle, the light being external light such as sunlight, or the red light LR or the near-infrared light LI that did not pass through the biological body, for example.

Figure 5:
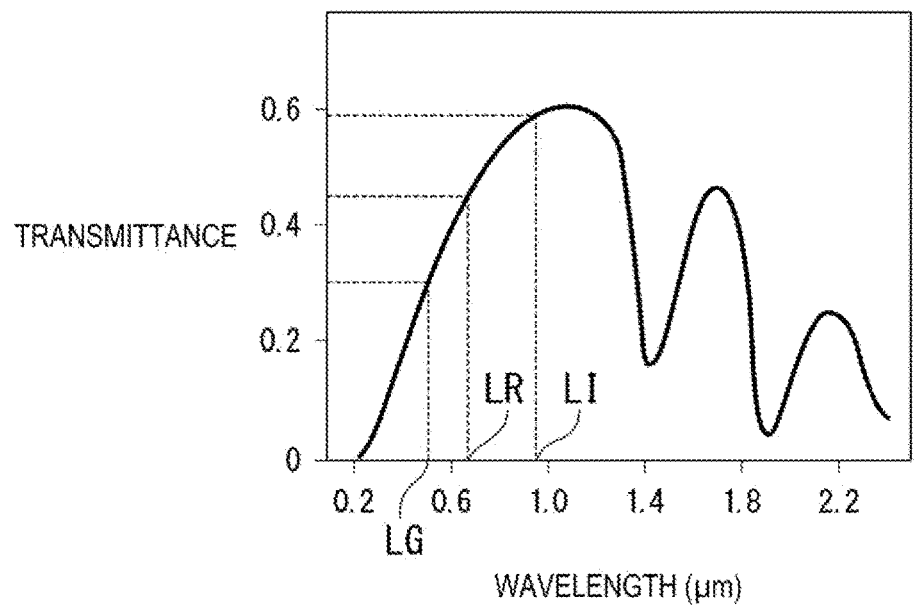
FIG. 5 is a graph illustrating a transmission spectrum of a skin.

FIG. 5 is a graph illustrating the transmission spectrum of a skin. In FIG. 5, the horizontal axis indicates the wavelength of light, and the vertical axis indicates the transmittance (Unit: %). FIG. 5 illustrates the transmission spectrum when the thickness of the skin is 0.43 mm, as an example.

The transmittance when the green light LG of the wavelength band (for example, 520 nm) is incident on a skin is approximately 30%, the transmittance when the red light LR of the wavelength band (for example, 660 nm) is incident on the skin is approximately 45%, and the transmittance when the near-infrared light LI of the wavelength band (for example, 905 nm) is incident on the skin is approximately 60%, as illustrated in FIG. 5.

The graph illustrated in FIG. 5 indicates that the distance by which light can propagate in the biological body differs for each of the wavelengths of the light. That is, according to the graph of FIG. 5, it can be understood that the green light LG can only propagate a short distance in the biological body compared to the red light LR or the near-infrared light LI. In other words, it may be said that the red light LR and the near-infrared light LI can propagate farther in the biological body than the green light LG. Note that an example is given of a case where the thickness of the skin is 0.43 mm in FIG. 5, and in the case where the thickness of the skin is different as well, the red light LR and the near-infrared light LI can propagate farther in the biological body than the green light LG.

In the following, operations of the detecting device 3 of the first embodiment will be described.

The detecting device 3 of the first embodiment includes the light-emitting unit 50 that emits the green light LG, the light-emitting unit 60 that emits the red light LR having a wavelength band higher than the wavelength band of the green light LG, the light-emitting unit 70 that emits the near-infrared light LI having a wavelength band higher than the wavelength band of the green light LG, the light-receiving unit 51 that receives the green light LG emitted from the light-emitting unit 50 and emitted from the measurement site M, the light-receiving unit 61 that receives the red light LR emitted from the light-emitting unit 60 and emitted from the measurement site M, and the light-receiving unit 61 that receives the near-infrared light LI emitted from the light-emitting unit 70 and emitted from the measurement site M. The light-receiving unit 51 includes the bandpass filter 515 that selectively transmits the green light LG, where the distance D1 from the light-emitting unit 50 to the light-receiving unit 51 is shorter than the distance D2 from the light-emitting unit 60 to the light-receiving unit 61. In the case of the first embodiment, the distance D1 from the light-emitting unit 50 to the light-receiving unit 51 is shorter than the distance D3 from the light-emitting unit 70 to the light-receiving unit 61.

That is, in the detecting device 3 of the first embodiment, the light-receiving unit 51 is disposed at the position closest to the light-emitting unit 50 that emits the green light LG. When the light-receiving unit 51 and the light-emitting unit 50 are arranged close to each other as such, the green light LG emitted from the light-emitting unit 50 propagates in the biological body only a short distance and comes to be incident on the light-receiving unit 51. As indicated by the graph of FIG. 5, the green light LG can only propagate a short distance in the biological body as described above, the green light LG emitted from the biological body can enter the light-receiving unit 51 with high intensity, provided that the distance between the light-emitting unit 50 that emits the green light LG and the light-receiving unit 51 that receives the green light LG is short.

In the case of the first embodiment, the light-receiving unit 51 is disposed at the position closest to the light-emitting unit 50, which makes it possible to maximize the light amount of the green light LG entering the light-receiving unit 51 by propagating in the biological body. Accordingly, it is possible for the detecting device 3, even when suppressing the luminescence amount of the green light LG in the light-emitting unit 50, to sufficiently detect, by the light-receiving unit 51, the green light LG propagated in the biological body.

Thus, it is possible for the detecting device 3 of the first embodiment to detect the green light LG with high accuracy by the light-receiving unit 51 while suppressing the luminescence amount of the green light LG emitted from the light-emitting unit 50 to reduce the power consumption of the light-emitting unit portion 11.

Here, a part of the red light LR and the near-infrared light LI emitted from the light-emitting unit 60 may enter the light-receiving unit 51 by passing through the biological body. In the case of the first embodiment, the light-receiving unit 51 includes the bandpass filter 515 that selectively transmits the green light LG. Accordingly, it is possible for the light-receiving unit 51 to cut off the red light LR and the near-infrared light LI having a wavelength band different from that of the green light LG. Thus, it is possible for the light-receiving unit 51 to efficiently receive the green light LG emitted from the light-emitting unit 50.

Figure 6:
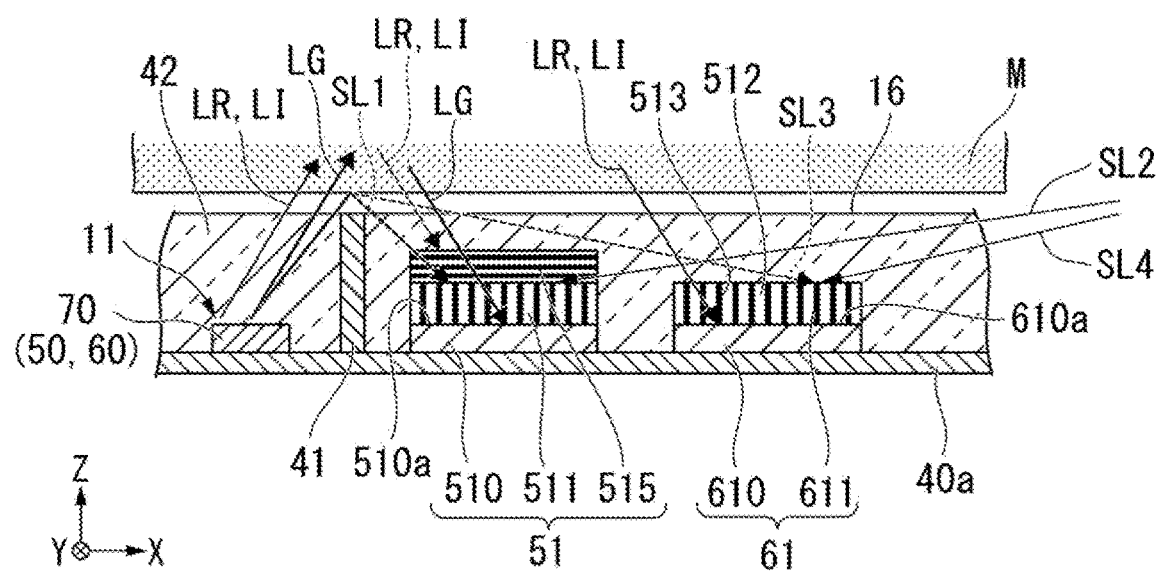
FIG. 6 is an explanatory view of an operation of a detecting device.

FIG. 6 is an explanatory view of an operation of the detecting device 3.

Apart of the green light LG emitted from the light-emitting unit 50 may be reflected by a biological surface (the measurement site M) or the like to thus directly enter the light-receiving unit 51 without passing through the biological body, as illustrated in FIG. 6. External light such as sunlight may also directly enter the light-receiving unit 51 through a gap between the biological body and the detection surface 16. In the following, the green light LG advancing toward the light-receiving unit 51 without passing through the biological body is referred to as "first stray light component SL1" and external light directly advancing toward the light-receiving unit 51 is referred to as "second stray light component SL2".

The first stray light component SL1, which has a green wavelength band, enters, by passing through the bandpass filter 515, the angle-limiting filter 511 provided at the lower layer of the bandpass filter 515. The angle-limiting filter 511 has characteristics of transmitting light incident at an angle smaller than the permissible incidence angle, and cutting off light incident at an angle greater than the permissible incidence angle, as described above.

The first stray light component SL1 enters the light-receiving unit 51 without passing through the biological body, thus the incidence angle of the green light LG with respect to the light-receiving unit 51 is greater than the permissible incidence angle of the angle-limiting filter 511. In other words, the first stray light component SL1 is cut off by the angle-limiting filter 511. This makes it possible for the light-receiving unit 51 to suppress, by the angle-limiting filter 511, an incidence of the first stray light component SL1 on the light-receiving surface 510a of the light-receiving element 510.

The second stray light component SL2 is basically cut off by the bandpass filter 515, while a component having a green wavelength band contained in the second stray light component SL2 passes through the bandpass filter 515. Here, the second stray light component SL2 enters through the gap between the biological body and the detection surface 16, an incidence angle of the second stray light component SL2 with respect to the light-receiving unit 51 is greater than the permissible incidence angle of the angle-limiting filter 511, as described above. Accordingly, a part (the component having a green wavelength band) of the second stray light component SL2 transmitted through the bandpass filter 515 is cut off by the angle-limiting filter 511. This makes it possible for the light-receiving unit 51 to suppress, by the angle-limiting filter 511, an incidence of the second stray light component SL2 on the light-receiving surface 510a of the light-receiving element 510.

As such, it is possible for the detecting device 3 of the first embodiment to cause the green light LG emitted from the light-emitting unit portion 11 and passing through the biological body to be efficiently incident on the light-receiving surface 510a of the light-receiving element 510. It is also possible for the detecting device 3 of the first embodiment to prevent the first stray light component SL1 and the second stray light component SL2 from being incident on the light-receiving surface 510a of the light-receiving element 510.

Thus, it is possible for the light-receiving unit 51 to achieve a high S/N ratio by suppression of an incidence of the first stray light component SL1 and the second stray light component SL2 that serve as noise sources. Accordingly, it is possible for the detecting device 3 of the first embodiment to receive the green light LG by the light-receiving unit 51 with high accuracy, which makes it possible, by suppression of the luminescence amount of the green light LG in the light-emitting unit 50, to suppress the power consumption of the light-emitting unit portion 11.

Also, in the detecting device 3 of the first embodiment, the distance (the distance D2 or the distance D3) between the light-emitting unit 60 and the light-emitting unit 70 and the light-receiving unit 61 is greater than the distance D1 between the light-emitting unit 50 and the light-receiving unit 51. In other words, the distance by which the red light LR and the near-infrared light LI propagate in the biological body until being incident on the light-receiving unit 61 is greater than the distance by which the green light LG propagates in the biological body until being incident on the light-receiving unit 51.

The green light LG can only propagate a short distance in the biological body compared to the red light LR or the near-infrared light LI, as illustrated in FIG. 5. Accordingly, supposing that the green light LG propagates in the biological body so as to be able to reach the light-receiving unit 61, the green light LG is in a state sufficiently attenuated when passing through the biological body. Thus, the green light LG is inhibited from being incident on the light-receiving unit 61.

In contrast, the red light LR and the near-infrared light LI can propagate farther in the biological body than the green light LG. Accordingly, it is possible for the red light LR and the near-infrared light LI, even when propagating a long distance in the biological body than the green light LG, to enter, in a state having sufficient light amount, the light-receiving unit 61 further away from the light-emitting unit portion 11.

In the case of the first embodiment, only the red light LR and the near-infrared light LI are incident on the light-receiving unit 61, thus it is unnecessary to provide, at the light-receiving unit 61, a bandpass filter configured to selectively transmit the red light LR and the near-infrared light LI and cut off the green light LG. That is, it is possible for the detecting device 3 of the first embodiment to employ the above-described configuration in which only the light-receiving unit 51 includes the bandpass filter 515 and the light-receiving unit 61 does not include a bandpass filter. Thus, it is possible for the detecting device 3 of the first embodiment to reduce cost by omitting a bandpass filter of the light-receiving unit 61.

In addition, a part of the red light LR emitted from the light-emitting unit 60 or a part of the near-infrared light LI emitted from the light-emitting unit 70 may directly enter the light-receiving unit 61 without passing through the biological body. Further, external light such as sunlight may directly enter the light-receiving unit 61 through the gap between the biological body and the detection surface 16. In the following, the red light LR or the near-infrared light LI directly advancing the light-receiving unit 61 without passing through the biological body is collectively referred to as "third stray light component SL3", and external light directly advancing toward the light-receiving unit 61 is referred to as "fourth stray light component SL4".

The third stray light component SL3 enters the angle-limiting filter 611 without passing through the biological body, thus the incidence angle of the third stray light component SL3 with respect to the light-receiving unit 61 is greater than the permissible incidence angle of the angle-limiting filter 611. Also, the fourth stray light component SL4 enters through the gap between the biological body and the detection surface 16, thus the incidence angle of the fourth stray light component SL4 with respect to the light-receiving unit 61 is greater than the permissible incidence angle of the angle-limiting filter 611.

Accordingly, the third stray light component SL3 and the fourth stray light component SL4 are properly cut off by the angle-limiting filter 611. This makes it possible for the light-receiving unit 61 to suppress, by the angle-limiting filter 611, an incidence of the third stray light component SL3 and the fourth stray light component SL4 on the light-receiving surface 610a of the light-receiving element 610.

As such, it is possible for the detecting device 3 of the first embodiment to cause the red light LR or the near-infrared light LI emitted from the light-emitting unit portion 11 and passing through the biological body to be efficiently incident on the light-receiving surface 610a of the light-receiving element 610. It is also possible for the detecting device 3 of the first embodiment to prevent the third stray light component SL3 and the fourth stray light component SL4 from being incident on the light-receiving surface 610a of the light-receiving element 610.

Thus, it is possible for the light-receiving unit 61 to achieve a high S/N ratio by suppression of an incidence of the third stray light component SL3 and the fourth stray light component SL4 that serve as noise sources. According to the detecting device 3 of the first embodiment, the red light LR and the near-infrared light LI are efficiently received by the light-receiving unit 61, which makes it possible, by suppression of the luminescence amount of the light-emitting unit 60 and the light-emitting unit 70, to suppress the power consumption of the light-emitting unit portion 11.

According to the detecting device 3 of the first embodiment, even when suppressing the luminescence amount of the light-emitting units 50, 60, and 70 to reduce the power consumption of the light-emitting unit portion 11, it is possible to receive light passing through the biological body by the light-receiving unit portion 12 with high accuracy, as described above. It is also possible for the detecting device 3 of the first embodiment to reduce cost by omitting a bandpass filter of the light-receiving unit 61.

It is further possible for the detecting device 3 of the first embodiment, where it is unnecessary as a countermeasure to the stray light to provide a light-shielding member between the light-receiving unit 51 and the light-receiving unit 61, to unnecessitate a space for providing the light-shielding member and to eventually miniaturize the device configuration by suppressing the detecting device 3 from growing in size.

Second Embodiment

Next, a detecting device of the second embodiment will be described. In the first embodiment, an example is given of a case where the light-receiving unit 61 receives both the red light LR and the near-infrared light LI, and a detecting device 3A of the second embodiment differs from the detecting device 3 of the first embodiment in that a light-receiving unit is provided that individually receives the red light LR and the near-infrared light LI.

Figure 7:
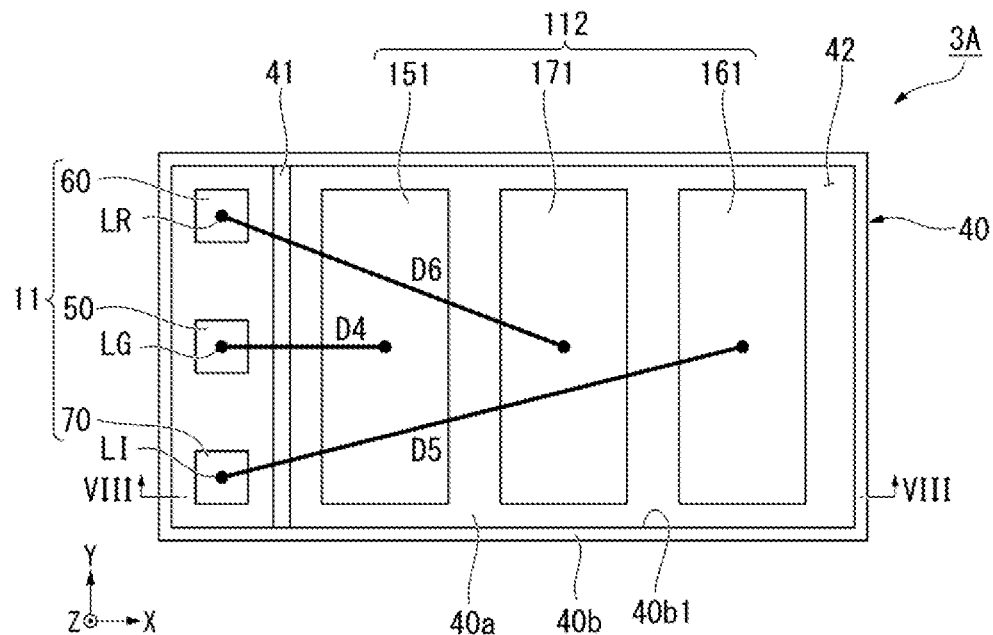
FIG. 7 is a plan view of a detecting device of the second embodiment.
Figure 8:
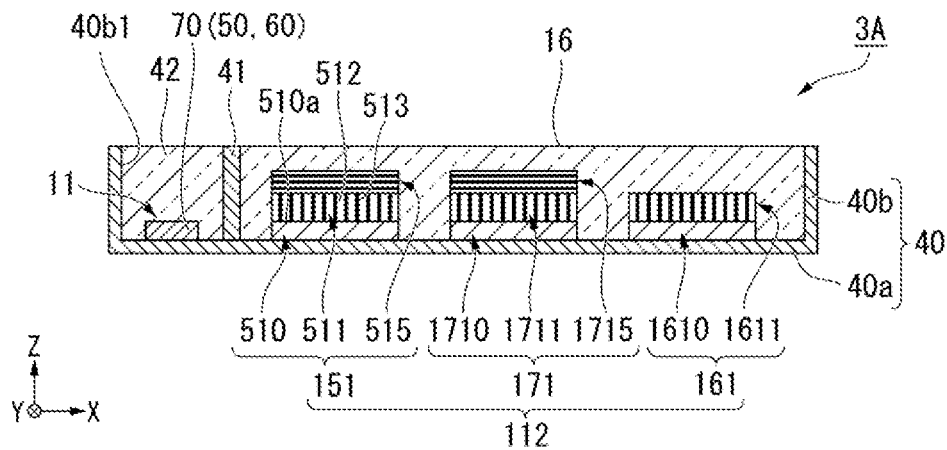
FIG. 8 is a cross-sectional view taken along the line VIII-VIII in FIG. 7.

FIG. 7 is a plan view of a detecting device of the second embodiment. FIG. 8 is a cross-sectional view taken along the line VIII-VIII in FIG. 7.

A light-receiving unit portion 112 of the detecting device 3A of the second embodiment includes a light-receiving unit (first light-receiving unit) 151, a light-receiving unit (second light-receiving unit) 161, and a light-receiving unit (third light-receiving unit) 171, as illustrated in FIGS. 7 and 8.

The light-receiving unit 151 receives the green light LG emitted from the light-emitting unit 50 and propagated inside the measurement site M, and generates a detection signal depending on the intensity of the received light.

The light-receiving unit 161 receives the near-infrared light LI emitted from the light-emitting unit 70 and propagated inside the measurement site M, and generates a detection signal depending on the intensity of the received light.

The light-receiving unit 171 receives the red light LR emitted from the light-emitting unit 60 and propagated inside the measurement site M, and generates a detection signal depending on the intensity of the received light.

That is, in the second embodiment, the light-emitting unit 50 corresponds to the "first light-emitting unit", and the green light LG emitted from the light-emitting unit 50 corresponds to the "first light". In addition, the light-emitting unit 70 corresponds to the "second light-emitting unit", and the near-infrared light LI emitted from the light-emitting unit 70 corresponds to the "second light". Further, the light-emitting unit 60 corresponds to the "third light-emitting unit", and the red light LR emitted from the light-emitting unit 60 corresponds to the "third light".

The detecting device 3A of the second embodiment differs from the detecting device 3 of the first embodiment in that the red light LR and the near-infrared light LI are individually received by two light-receiving units (the light-receiving unit 171 and the light-receiving unit 161).

The light-receiving unit portion 112 is installed inside the case 40 such that the light-receiving surfaces of the light-receiving units 151, 171, and 161 are parallel to the XY plane. Specifically, the light-receiving unit 151 is disposed on the +X side of the light-emitting unit portion 11, the light-receiving unit 171 is disposed on the +X side of the light-receiving unit 151, and the light-receiving unit 161 is disposed on the +X side of the light-receiving unit 171. That is, the light-receiving unit 171 is disposed between the light-receiving unit 151 and the light-receiving unit 161.

In the second embodiment, the distance from the light-emitting unit 50 to the light-receiving unit 151 is designated as D4. The distance D4 corresponds to the distance between the center portions of the light-emitting unit 50 and the light-receiving unit 151 when these are planarly viewed in the Z axis direction.

In addition, the distance from the light-emitting unit 70 to the light-receiving unit 161 is designated as D5. The distance D5 corresponds to the distance between the center portions of the light-emitting unit 70 and the light-receiving unit 161 when these are planarly viewed in the Z axis direction.

Further, the distance from the light-emitting unit 60 to the light-receiving unit 171 is designated as D6. The distance D6 corresponds to the distance between the center portions of the light-emitting unit 60 and the light-receiving unit 171 when these are planarly viewed in the Z axis direction.

In the detecting device 3A of the second embodiment, the distance D4 from the light-emitting unit 50 to the light-receiving unit 151 is shorter than the distance D5 from the light-emitting unit 70 to the light-receiving unit 161. Also, the distance D4 from the light-emitting unit 50 to the light-receiving unit 151 is shorter than the distance D6 from the light-emitting unit 60 to the light-receiving unit 171. Note that the distance D6 is shorter than the distance D5.

The detecting device 3A of the second embodiment also employs a configuration in which the light-receiving unit 151 for receiving the green light LG is disposed at the position closest to the light-emitting unit 50 that emits the green light LG as in the first embodiment.

The light-receiving unit 151 has the same configuration as the light-receiving unit 51 of the first embodiment. That is, the light-receiving unit 151 includes the light-receiving element 510 that receives the green light LG, the angle-limiting filter 511, and the bandpass filter 515.

The detecting device 3A of the second embodiment employs a configuration in which the light-receiving unit 161 that receives the near-infrared light LI is disposed at the position farthest away from the light-emitting unit portion 11. The light-receiving unit 161 has the same configuration as the light-receiving unit 61 of the first embodiment. The light-receiving unit 161 includes a light-receiving element (second sensor unit) 1610 that receives the near-infrared light LI, and an angle-limiting filter (second angle-limiting filter) 1611 that limits an incidence angle of the near-infrared light LI reaching the light-receiving element 1610.

The green light LG can only propagate a short distance in the biological body compared to the red light LR or the near-infrared light LI. Accordingly, the green light LG never reaches the light-receiving unit 161. Also, the red light LR propagates a shorter distance in the biological body than the near-infrared light LI, as illustrated in FIG. 5. Accordingly, the red light LR is in a state sufficiently attenuated in the biological body until reaching the light-receiving unit 161, and thus a small light amount of the red light LR is incident on the light-receiving unit 161. Thus, according to the detecting device 3A of the second embodiment, it is possible, in the light-receiving unit 161, to omit a bandpass filter that selectively transmits the near-infrared light LI. Consequently, it is possible for the detecting device 3A of the second embodiment to reduce cost by omitting a bandpass filter of the light-receiving unit 161.

The light-receiving unit 171 has the same configuration as the light-receiving unit 151. That is, the light-receiving unit 171 includes a light-receiving element 1710 that receives the red light LR, an angle-limiting filter 1711 that limits an incidence angle of the red light LR reaching the light-receiving element 1710, and a bandpass filter 1715 that selectively transmits the red light LR. The bandpass filter 1715 has characteristics of selectively transmitting a wavelength band of the red light LR, and absorbing and cutting off the green light LG and the near-infrared light LI.

In the detecting device 3A of the second embodiment, the distance (the distance D6) between the light-emitting unit 60 that emits the red light LR and the light-receiving unit 171 that receives the red light LR is shorter than the distance (the distance D5) between the light-emitting unit 70 that emits the near-infrared light LI and the light-receiving unit 161 that receives the near-infrared light LI. Accordingly, the green light LG propagated in the biological body may enter the light-receiving unit 171 in a state of not sufficiently attenuated.

It is also possible for the near-infrared light LI to propagate a longer distance in the biological body than the green light LG, thus there is a risk that the near-infrared light LI may enter the light-receiving unit 171 with a higher intensity than the green light LG. In contrast, in the case of the second embodiment, it is possible for the light-receiving unit 171 including the bandpass filter 1715 to cause the red light LR to be efficiently incident on the light-receiving element 1710.

According to the detecting device 3A of the second embodiment, it is possible to prevent a stray light component from being incident on the light-receiving unit 151, and cause the green light LG emitted from the light-emitting unit portion 11 and passing through the biological body to be efficiently incident on the light-receiving unit 151.

Also, according to the detecting device 3A of the second embodiment, it is possible to prevent a stray light component from being incident on the light-receiving unit 151, and cause the red light LR emitted from the light-emitting unit portion 11 and passing through the biological body to be efficiently incident on the light-receiving unit 171. It is also possible to prevent a stray light component from being incident on the light-receiving unit 161, and cause the near-infrared light LI emitted from the light-emitting unit portion 11 and passing through the biological body to be efficiently incident on the light-receiving unit 161.

According to the detecting device 3A of the second embodiment, it is possible to receive light by the light-receiving units 151, 161, and 171, which makes it possible, by suppression of the luminescence amount of the light-emitting units 50, 60, and 70, to suppress the power consumption of the light-emitting unit portion 11, as described above. Also, according to the detecting device 3A of the second embodiment, a light-shielding member becomes unnecessary as a countermeasure for the stray light, which makes it possible to miniaturize the device configuration.

Third Embodiment

Next, a measuring device 100B of the third embodiment will be described. The measuring device 100B of the third embodiment differs from the measuring device 100 of the first embodiment in that a detecting device 3B is provided in place of the detecting device 3.

Figure 9:
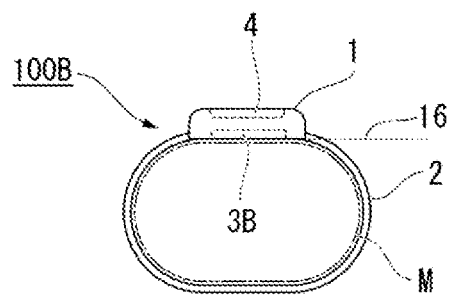
FIG. 9 is a side view of a measuring device of the third embodiment.

FIG. 9 is a side view of the measuring device 100B of the third embodiment. The measuring device 100B of the third embodiment illustrated in FIG. 9 is a biometric measuring device that non-invasively measures biometric information of an examinee (for example, a human) that is an exemplification of a biological body, and is mounted on a site M to be measured (hereinafter referred to as "measurement site") of the body of the examinee.

Figure 10:
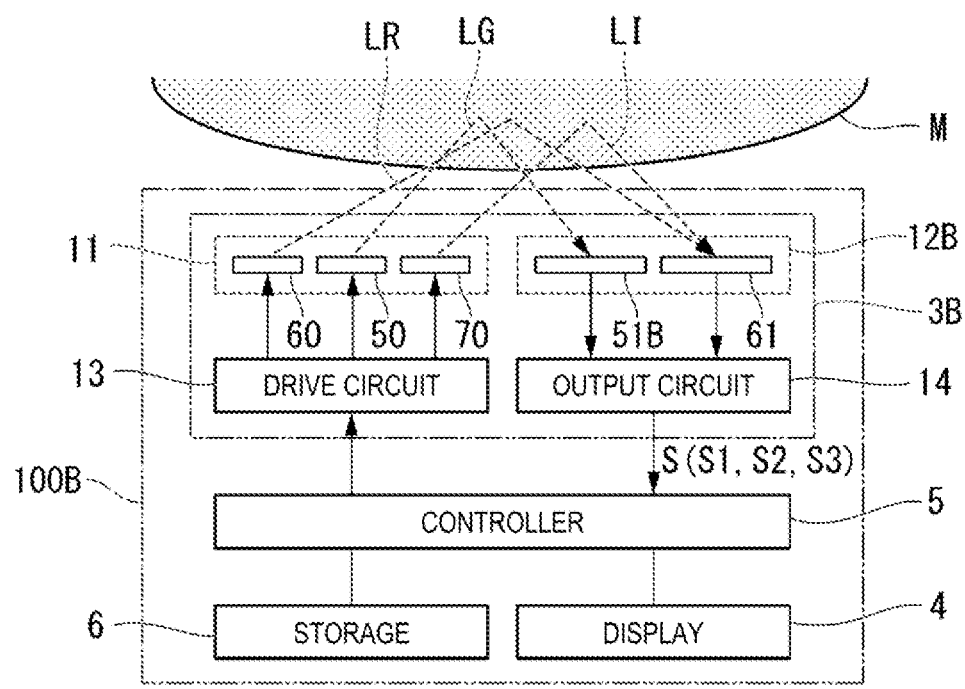
FIG. 10 is a configuration diagram focused on a function of the measuring device.

FIG. 10 is a configuration diagram focused on the function of the measuring device 100B. The measuring device 100B of the third embodiment includes the controller 5, the storage 6, the display 4, and the detecting device 3B, as illustrated in FIG. 10.

The detecting device 3B is an optical sensor module that generates the detection signal S of the measurement site M. The detecting device 3B is installed at an opposite surface (hereinafter referred to as detection surface) 16, to the measurement site M, of the housing portion 1, for example, as illustrated in FIG. 9. The detecting device 3B of the third embodiment includes the light-emitting unit portion 11, a light-receiving unit portion 12B, the drive circuit 13, and the output circuit 14, as illustrated in FIG. 10. Note that one or both of the drive circuit 13 and the output circuit 14 may be installed as an external circuit of the detecting device 3B. That is, the drive circuit 13 and the output circuit 14 may be omitted from the detecting device 3B.

In the detecting device 3B of the third embodiment, light emitted from the light-emitting units 50, 60, and 70 is incident on the measurement site M and propagates while repeatedly reflected and scattered inside the measurement site M, then the light is emitted to the side of the housing portion 1 to reach the light-receiving unit portion 12B. That is, the detecting device 3B of the third embodiment is a reflection-type optical sensor in which the light-emitting unit portion 11 and the light-receiving unit portion 12B are located on one side with respect to the measurement site M.

The light-receiving unit portion 12B receives light coming from the measurement site by the emission of the light-emitting unit portion 11. The light-receiving unit portion 12B of the third embodiment includes a light-receiving unit (first light-receiving unit) 51B, and the light-receiving unit (second light-receiving unit) 61. The light-receiving unit 51B and the light-receiving unit 61 generate a detection signal depending on the intensity of the received light. In the following, when the light-receiving unit 51B and the light-receiving unit 61 are not particularly distinguished, these are collectively referred to as "light-receiving units 51B and 61".

The light-receiving unit 51B receives the green light LG emitted from the light-emitting unit 50 and propagated inside the measurement site M, and generates a detection signal depending on the intensity of the received light. The light-receiving unit 61 receives the red light LR emitted from the light-emitting unit 60 and propagated inside the measurement site M, or the near-infrared light LI emitted from the light-emitting unit 70 and propagated inside the measurement site M, and generates a detection signal depending on the intensity of the received light.

The output circuit 14 includes an A/D converter that converts detection signals generated by the light-receiving units 51B and 61 from analog to digital, and an amplification circuit that amplifies the detection signals after the conversion (both of these are not illustrated), and generates a plurality of the detection signals S (S1, S2, and S3) corresponding to mutually different wavelengths, for example.

The detection signal S1 of the third embodiment is a signal indicating the intensity of the green light LG emitted from the light-emitting unit 50 and received by the light-receiving unit 51B. The detection signal S2 is a signal indicating the intensity of the red light LR emitted from the light-emitting unit 60 and received by the light-receiving unit 61, and the detection signal S3 is a signal indicating the intensity of the near-infrared light LI emitted from the light-emitting unit 70 and received by the light-receiving unit 61.

Note that the drive circuit 13 and the output circuit 14 are mounted, in the form of IC chips, on a wiring board together with the light-emitting unit portion 11 and the light-receiving unit portion 12B. Note that it is also possible to install the drive circuit 13 and the output circuit 14 at the outside of the detecting device 3B, as described above.

The controller 5 is an arithmetic processing device such as a Central Processing Unit (CPU) or an FPGA (Field-Programmable Gate Array), and controls the entirety of the measuring device 100B.

The controller 5 of the third embodiment also executes the program stored in the storage 6 to identify the biometric information of the examinee from the plurality of the detection signals S (S1, S2, and S3) generated by the detecting device 3B. Specifically, the controller 5 determines the pulse wave of the examinee from the detection signal S1 indicating the intensity of the green light LG received by the light-receiving unit 51B. The controller 5 is configured to identify the pulse rate of the examinee based on the detection signal S1, for example. The controller 5 is also configured to identify the oxygen saturation of the examinee by analyzing the detection signal S2 indicating the intensity of the red light LR received by the light-receiving unit 61 and the detection signal S3 indicating the intensity of the near-infrared light LI received by the light-receiving unit 61.

As such, the controller 5 functions as an information analysis unit that determines the biometric information from the detection signal S indicating a detection result of the detecting device 3B. The controller (information analysis unit) 5 causes the display 4 to display the biometric information identified from the detection signal S. Note that it is also possible to notify the user of the measurement result by means of audio output. A configuration is also preferred that notifies the user of a warning (a possibility of impairment in physical function) when the pulse rate or the oxygen saturation varies to a numerical value out of a predetermined range.

Figure 11:
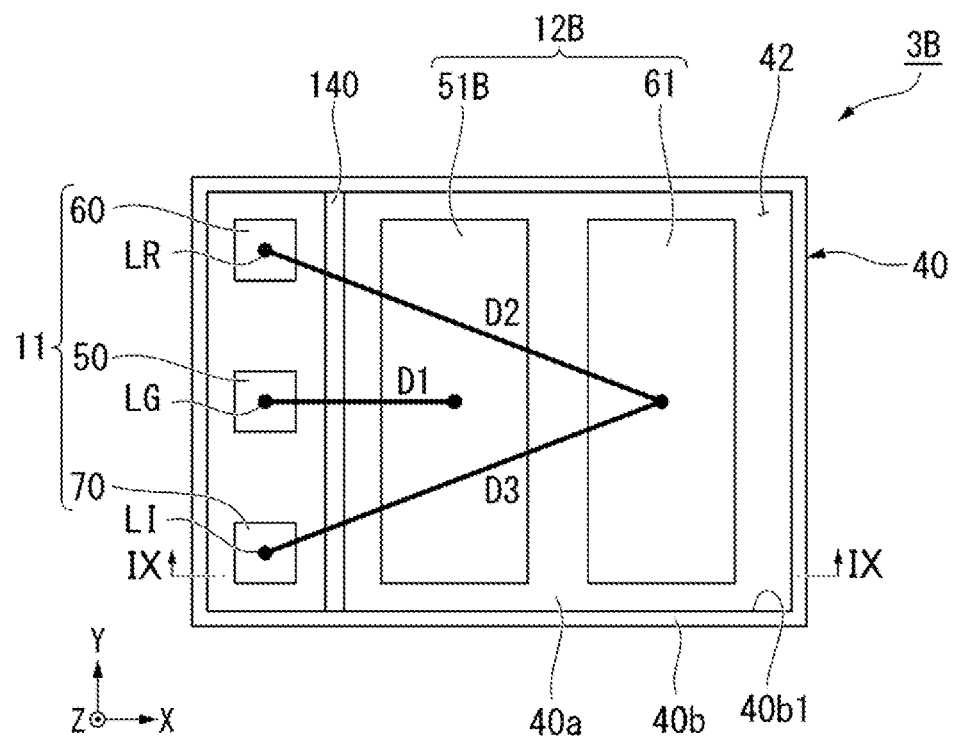
FIG. 11 is a plan view of a detecting device.
Figure 12:
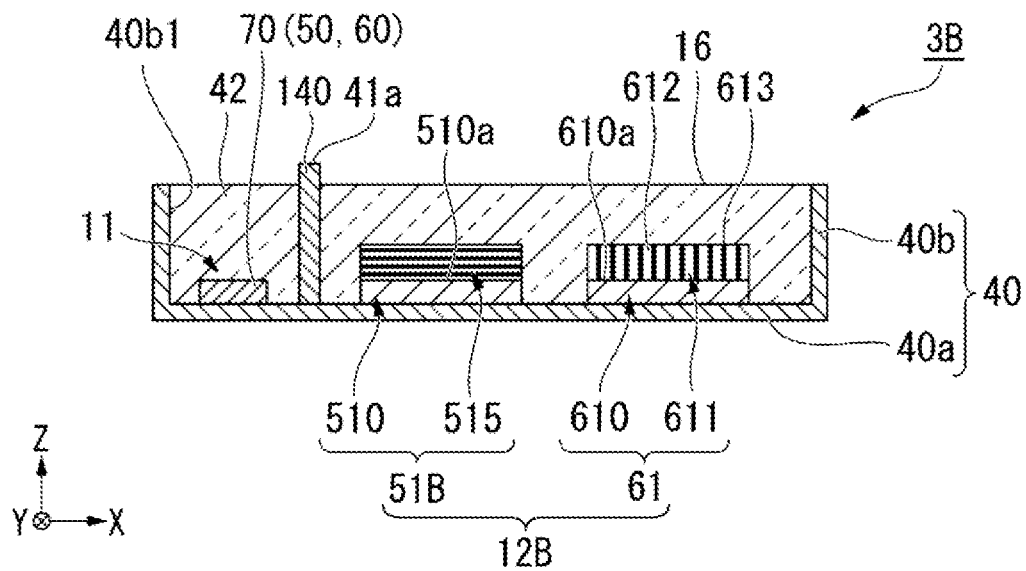
FIG. 12 is a cross-sectional view taken along a line IX-IX in FIG. 11.

FIG. 11 is a plan view of the detecting device 3B. FIG. 12 is a cross-sectional view taken along the line IX-IX in FIG. 11. The detecting device 3B of the third embodiment further includes the case 40, a first light-shielding wall 140, and the sealing layer 42 in addition to the light-emitting unit portion 11 and the light-receiving unit portion 12B, as illustrated in FIGS. 11 and 12. Note that the drive circuit 13 and the output circuit 14 are omitted in illustration from FIGS. 11 and 12.

In the following, a configuration of the detecting device 3B will be described using an XYZ coordinate system. The X axis corresponds to an axis along a long side (one side) of the case 40 having a rectangular shape, the Y axis is orthogonal to the X axis and corresponds to an axis along a short side (the other one side) of the case 40, and the Z axis is orthogonal to each of the X axis and the Y axis and corresponds to an axis along the normal line of the detection surface 16 in contact with the measurement site M.

The case 40 is a member housing the elements (the light-emitting unit portion 11 and the light-receiving unit portion 12B) constituting the detecting device 3B, as illustrated in FIGS. 11 and 12. The case 40 has a box shape including a rectangular flat plate-shaped bottom surface portion 40a and rectangular frame-shaped side plate portions 40B protruding from the periphery of the bottom surface portion 40a to the +Z side.

The light-emitting unit portion 11 and the light-receiving unit portion 12B are mounted on the bottom surface portion 40a of the case 40 in a state mounted on a wiring board (not illustrated). The first light-shielding wall 140 is disposed, in the direction along the X axis, between the light-emitting unit portion 11 and the light-receiving unit portion 12B. The first light-shielding wall 140 is a plate-like member extending in the Y axis direction and protrudes from the bottom surface portion 40a to the +Z side. The light-shielding wall 41 separates, in the X axis direction, the housing space inside the case 40 into two spaces. That is, the light-shielding wall 41 is a member that isolates, in the direction along the X axis, the spaces housing the light-emitting unit portion 11 and the light-receiving unit portion 12B. The first light-shielding wall 140 is a member having light-shielding properties for blocking light emitted from the light-emitting unit portion 11 from directly entering the light-receiving unit portion 12B.

In the third embodiment, the first light-shielding wall 140 is provided, in the direction along the X axis, between the light-emitting unit portion 11 including the light-emitting unit 50, the light-emitting unit 60, and the light-emitting unit 70, and the light-receiving unit 51B. The first light-shielding wall 140 may also be referred to as member that blocks a part of the green light LG, the red light LR, and the near-infrared light LI.

The sealing layer 42 is a light-transmissive resin material filled into a gap between the light-emitting unit portion 11, the light-receiving unit portion 12B that are housed inside the case 40, and the side plate portion 40B. In the third embodiment, the sealing layer 42 seals the light-emitting units 50, 60, and 70 and the light-receiving units 51B and 61. The sealing layer 42 seals (molds), inside the case 40, the light-emitting unit portion 11 and the light-receiving unit portion 12B. The surface of the sealing layer 42 functions as the detection surface 16.

In the third embodiment, a leading end portion 41a of the first light-shielding wall 140 protrudes from the surface (the detection surface 16) of the sealing layer 42. The height of the protrusion of the first light-shielding wall 140 from the sealing layer 42 at the leading end portion 41a is set such that the leading end portion 41a abuts against the measurement site M in a state where the measuring device 100B is mounted on the measurement site M of the examinee, for example.

Note that a configuration may be employed in which the upper surface of the side plate portion 40B of the case 40 is covered by a translucent substrate in place of the configuration in which the sealing layer 42 seals the components. In this case, the upper surface of the translucent substrate functions as the detection surface 16. The leading end portion 41a of the first light-shielding wall 140 is also set in a state protruding from the upper surface of the translucent substrate.

The light-emitting unit portion 11 is the same as in the above-described embodiments, and a description thereof is thus omitted.

The light-receiving unit portion 12B is disposed inside the case 40 such that the light-receiving surfaces of the light-receiving units 51B and 61 are parallel to the XY plane. That is, the light-receiving units 51B and 61 are configured to receive light incident in the Z direction.

The light-receiving units 51B and 61 are disposed side-by-side spaced apart from one another in the direction (second direction) along the X axis intersecting (orthogonal to) the Y axis, as illustrated in FIG. 11. Specifically, the light-receiving unit 51B is disposed on the +X side of the light-emitting unit portion 11, and the light-receiving unit 61 is disposed on the +X side of the light-receiving unit 51B. That is, the light-receiving unit 61 is disposed on an opposite side from the light-emitting unit portion 11, interposing the light-receiving unit 51B therebetween.

Here, the distance from the light-emitting unit 50 to the light-receiving unit 51B is designated as D1, the distance from the light-emitting unit 60 to the light-receiving unit 61 is designated as D2, and the distance from the light-emitting unit 70 to the light-receiving unit 61 is designated as D3. The distance D1 corresponds to the distance between the center portions of the light-emitting unit 50 and the light-receiving unit 51B when these are planarly viewed in the Z axis direction. In addition, the distance D2 corresponds to the distance between the center portions of the light-emitting unit 60 and the light-receiving unit 61 when these are planarly viewed from the Z axis direction. Further, the distance D3 corresponds to the distance between the center portions of the light-emitting unit 70 and the light-receiving unit 61 when these are planarly viewed from the Z axis direction.

In the detecting device 3B of the third embodiment, the distance D1 from the light-emitting unit 50 to the light-receiving unit 51B is shorter than the distance D2 from the light-emitting unit 60 to the light-receiving unit 61. Also, the distance D1 from the light-emitting unit 50 to the light-receiving unit 51B is shorter than the distance D3 from the light-emitting unit 70 to the light-receiving unit 61. Note that the distance D2 is equal to the distance D3.

As such, the detecting device 3B of the third embodiment employs the configuration in which the light-receiving unit 51B for receiving the green light LG is disposed at the position closest to the light-emitting unit 50 that emits the green light LG.

The light-receiving unit 51B includes the light-receiving element 510 that receives the green light LG and the bandpass filter 515, provided on the light-receiving element 510, that selectively transmits the green light LG, as illustrated in FIG. 12. That is, the detecting device 3B of the third embodiment includes the bandpass filter 515, provided on the light-receiving element 510, that selectively transmits the green light LG.

The light-receiving element 510 is constituted by a photodiode (Pd), for example.

The bandpass filter 515 has characteristics of selectively transmitting a wavelength band of the green light LG, and absorbing and cutting off the red light LR and the near-infrared light LI that are light in the other wavelength bands. The bandpass filter 515 is formed by alternately layering a low refractive index layer such as silicon oxide and a high refractive index layer such as titanium oxide on the light-receiving element 510, for example.

In contrast, the light-receiving unit 61 includes the light-receiving element 610 that receives the red light LR or the near-infrared light LI, and the angle-limiting filter 611 that limits an incidence angle of the red light LR or the near-infrared light LI reaching the light-receiving element 610. That is, in the detecting device 3B of the third embodiment, the light-receiving unit 61 has a configuration different from that of the light-receiving unit 51B in that the light-receiving unit 61 does not include a bandpass filter that selectively transmits the red light LR or the near-infrared light LI and the light-receiving unit 61 includes the angle-limiting filter 611.

The light-receiving element 610 is configured by a photodiode, for example. The angle-limiting filter 611 is provided on the light-receiving surface 610a of the light-receiving element 610. The angle-limiting filter 611 is formed by embedding a plug 613 formed of a light-shielding material such as tungsten inside a silicon oxide layer 612 having light transmissivity, for example.

The silicon oxide layer 612 forms a light path that guides light to the light-receiving surface 610a of the light-receiving element 610. The plug 613 embedded in the silicon oxide layer 612 limits an incidence angle of light passing through the optical path (the silicon oxide layer 612). That is, when the light entering the silicon oxide layer 612 is inclined more than a predetermined angle with respect to the optical path, the incident light iremits the plug 613, where a part of the light is absorbed by the plug 613 and the rest of the light is reflected. Then, the intensity of the reflected light is weakened by repeated reflection occurring until passing through the optical path, thus the light that can eventually pass through the angle-limiting filter 511 will be substantially limited to light inclined with respect to the light path at an angle within a predetermined limited angle.

The angle-limiting filter 611 has characteristics of transmitting light incident at an angle smaller than a predetermined incidence angle, and cutting off light incident at an angle greater than the predetermined incidence angle without transmitting the light. Here, the predetermined incidence angle means an angle formed with respect to the normal line of the light-receiving surface 610a of the light-receiving element 610.

This makes it possible to cause the angle-limiting filter 611 to limit an incidence angle of light incident on the light-receiving element 610. Specifically, the angle-limiting filter 611 transmits the red light LR and the near-infrared light LI incident at a predetermined incidence angle (hereinafter, referred to as permissible incidence angle) by propagating in the biological body, and cuts off light incident at an angle greater than the permissible incidence angle, the light being external light such as sunlight or light that did not enter the biological body.

In the following, operations of the detecting device 3B of the third embodiment will be described.

The detecting device 3B of the third embodiment includes the light-emitting unit 50 that emits the green light LG, the light-emitting unit 60 that emits the red light LR having a wavelength band higher than that of the green light LG, the light-emitting unit 70 that emits the near-infrared light LI having a wavelength band higher than that of the green light LG, the light-receiving unit 51B that receives the green light LG emitted from the light-emitting unit 50 and emitted from the measurement site M, the light-receiving unit 61 that receives the red light LR emitted from the light-emitting unit 60 and emitted from the measurement site M, and the near-infrared light LI emitted from the light-emitting unit 60 and emitted from the measurement site M, and the bandpass filter 515, provided on the light-receiving element 510 of the light-receiving unit 51B, that selectively transmits the green light LG. The distance D1 from the light-emitting unit 50 to the light-receiving unit 51B is shorter than the distance D2 from the light-emitting unit 60 to the light-receiving unit 61. In the case of the third embodiment, the distance D1 from the light-emitting unit 50 to the light-receiving unit 51B is shorter than the distance D3 from the light-emitting unit 70 to the light-receiving unit 61.

That is, in the detecting device 3B of the third embodiment, the light-receiving unit 51B is disposed at the position closest to the light-emitting unit 50 that emits the green light LG. When the light-receiving unit 51B and the light-emitting unit 50 are arranged close to each other as such, the green light LG emitted from the light-emitting unit 50 propagates in the biological body only a short distance and comes to be incident on the light-receiving unit 51B. As indicated by the graph of FIG. 5 as well, the green light LG can only propagate a short distance in the biological body as described above, the green light LG emitted from the biological body can enter the light-receiving unit 51B with high intensity, provided that the distance between the light-emitting unit 50 that emits the green light LG and the light-receiving unit 51B that receives the green light LG is short.

In the case of the third embodiment, the light-receiving unit 51B is disposed at the position closest to the light-emitting unit 50, which makes it possible to maximize the light amount of the green light LG entering the light-receiving unit 51B by propagating in the biological body. Accordingly, it is possible for the detecting device 3B, even when suppressing the luminescence amount of the green light LG in the light-emitting unit 50, to sufficiently detect, by the light-receiving unit 51B, the green light LG propagated in the biological body.

Thus, it is possible for the detecting device 3B of the third embodiment to detect the green light LG by the light-receiving unit 51B with high accuracy while suppressing the luminescence amount of the green light LG emitted from the light-emitting unit 50 to reduce the power consumption of the light-emitting unit portion 11.

Here, a part of the red light LR and the near-infrared light LI emitted from the light-emitting unit 60 may enter the light-receiving unit 51B by passing through the biological body. In the case of the third embodiment, the bandpass filter 515 that selectively transmits the green light LG is provided on the light-receiving element 510 of the light-receiving unit 51B. Accordingly, it is possible for the light-receiving unit 51B to cut off the red light LR and the near-infrared light LI having a wavelength band different from that of the green light LG. Thus, it is possible for the light-receiving unit 51B to efficiently receive the green light LG emitted from the light-emitting unit 50.

Incidentally, there is also a risk that a part of the green light LG emitted from the light-emitting unit 50 may be reflected by a biological surface (the measurement site M) or the like to thus directly enter the light-receiving unit 51B without passing through the biological body. External light such as sunlight may also directly enter the light-receiving unit 51B through the gap between the biological body and the detection surface 16. Similarly, there is also a risk that a part of the red light LR emitted from the light-emitting unit 60 or a part of the near-infrared light LI emitted from the light-emitting unit 70 may be reflected by the measurement site M to thus directly enter the light-receiving unit 61 without passing through the biological body.

In the following, the green light LG advancing toward the light-receiving unit 51B without passing through the biological body is referred to as "stray light component SL1", and the red light LR or the near-infrared light LI advancing toward the light-receiving unit 61 without passing through the biological body is collectively referred to as "stray light component SL3".

Figure 13:
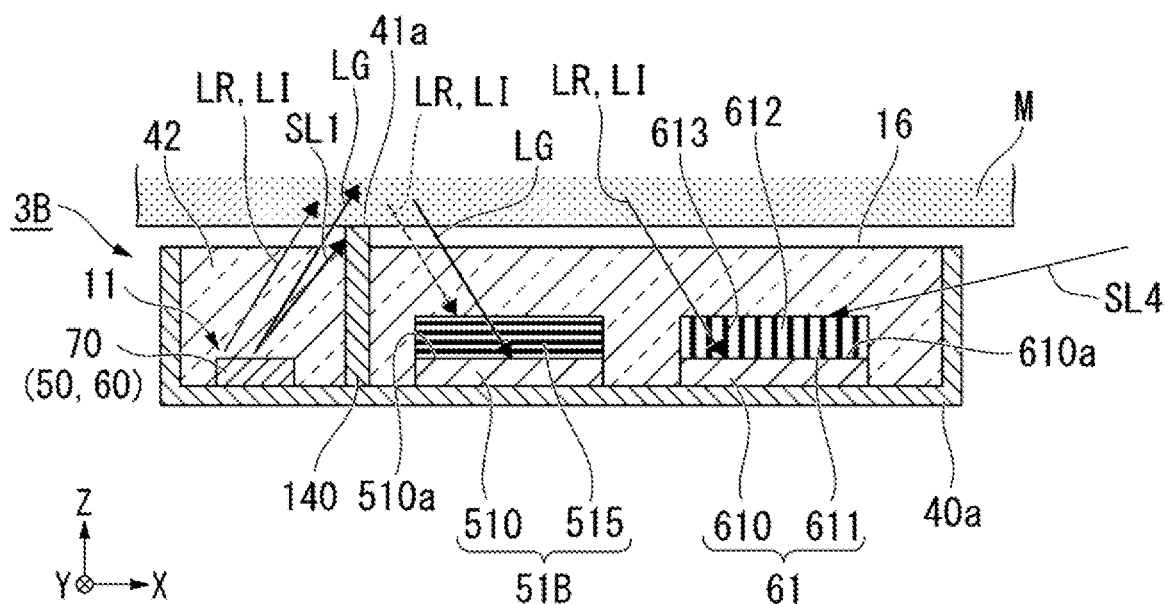
FIG. 13 is an explanatory view of an operation of a detecting device.

FIG. 13 is an explanatory view of an operation of the detecting device 3B.

In the detecting device 3B of the third embodiment, the leading end portion 41a of the first light-shielding wall 140 protrudes more than the detection surface 16, whereby the leading end portion 41a makes contact with the measurement site M, as illustrated in FIG. 13. Accordingly, no gap between the measurement site M and the detection surface 16 is created between the light-emitting unit 50 and the light-receiving unit 51B. The stray light component SL1 and the stray light component SL3 are blocked by the leading end portion 41a. Thus, according to the detecting device 3B of the third embodiment, it is possible to suppress an incidence of the stray light component SL1 on the light-receiving surface 510a of the light-receiving element 510 and an incidence of the stray light component SL3 on the light-receiving unit 61.

As such, it is possible for the detecting device 3B of the third embodiment to cause the green light LG emitted from the light-emitting unit portion 11 and passing through the biological body to be efficiently incident on the light-receiving surface 510a of the light-receiving element 510. It is also possible for the detecting device 3B of the third embodiment, in which the leading end portion 41a of the first light-shielding wall 140 protruding more than the detection surface 16 is in contact with the measurement site M, to suppress an incidence of the stray light component SL1 on the light-receiving surface 510a of the light-receiving element 510 and an incidence of the stray light component SL3 on the light-receiving surface 510a of the light-receiving element 510.

Thus, it is possible for the light-receiving unit 51B to achieve a high S/N ratio by suppression of an incidence of the stray light component SL1 serving as a noise source. Accordingly, it is possible for the detecting device 3B of the third embodiment to receive the green light LG by the light-receiving unit 51B with high accuracy, which makes it possible, by suppression of the luminescence amount of the green light LG in the light-emitting unit 50, to suppress the power consumption of the light-emitting unit portion 11.

Also, in the detecting device 3B according to the third embodiment, the distance (the distance D2 or the distance D3) between the light-emitting unit 60 and the light-emitting unit 70, and the light-receiving unit 61 is greater than the distance D1 between the light-emitting unit 50 and the light-receiving unit 51B. In other words, the distance by which the red light LR and the near-infrared light LI propagate in the biological body until being incident on the light-receiving unit 61 is greater than the distance by which the green light LG propagates in the biological body until being incident on the light-receiving unit 51B.

The green light LG can only propagate a short distance in the biological body compared to the red light LR or the near-infrared light LI, as illustrated in FIG. 5 as well. Accordingly, supposing that the green light LG propagates in the biological body so as to be able to reach the light-receiving unit 61, the green light LG is in a state sufficiently attenuated when passing through the biological body. Thus, the green light LG is inhibited from being incident on the light-receiving unit 61.

In contrast, the red light LR and the near-infrared light LI can propagate farther in the biological body than the green light LG. Accordingly, it is possible for the red light LR and the near-infrared light LI, even when propagating a long distance in the biological body than the green light LG, to enter, in a state having sufficient light amount, the light-receiving unit 61 further away from the light-emitting unit portion 11.

In the case of the third embodiment as well, only the red light LR and the near-infrared light LI are incident on the light-receiving unit 61, thus it is unnecessary to provide, at the light-receiving unit 61, a bandpass filter configured to selectively transmit the red light LR and the near-infrared light LI and cut off the green light LG. That is, it is possible for the detecting device 3B of the third embodiment to employ the above-described configuration in which only the light-receiving unit 51B includes the bandpass filter 515 and the light-receiving unit 61 does not include a bandpass filter. Thus, it is possible for the detecting device 3B of the third embodiment to reduce cost by omitting a bandpass filter of the light-receiving unit 61.

Also, in the detecting device 3B of the third embodiment, the light-receiving unit 61 is disposed closer to the side plate portion 40B of the case 40 than the light-receiving unit 51B. Accordingly, external light such as sunlight may directly enter the light-receiving unit 61 through the gap between the measurement site M and the detection surface 16. In the following, the external light directly advancing toward the light-receiving unit 61 is referred to as "stray light component SL4".

The stray light component SL4 enters through the gap between the measurement site M and the detection surface 16, thus the incidence angle of the stray light component SL4 with respect to the light-receiving unit 61 is greater than the permissible incidence angle of the angle-limiting filter 611. Accordingly, the stray light component SL4 is properly cut off by the angle-limiting filter 611. This makes it possible for the light-receiving unit 61 to suppress, by the angle-limiting filter 611, an incidence of stray light components SL4 on the light-receiving surface 610a of the light-receiving element 610.

As such, it is possible for the detecting device 3B of the third embodiment to cause the red light LR or the near-infrared light LI emitted from the light-emitting unit portion 11 and passing through the biological body to be efficiently incident on the light-receiving surface 610a of the light-receiving element 610. It is also possible for the detecting device 3B of the third embodiment, in which the angle-limiting filter 611 is provided on the light-receiving surface 610a of the light-receiving element 610, to suppress an incidence of the stray light component SL4 to the light-receiving surface 610a of the light-receiving element 610.

According to the light-receiving unit 61 of the third embodiment, it is possible to achieve a high S/N ratio by suppression of an incidence of the stray light component SL3 and the stray light component SL4 that serve as noise sources. According to the detecting device 3B of the third embodiment, the red light LR and the near-infrared light LI are efficiently received by the light-receiving unit 61, which makes it possible, by suppression of the luminescence amount of the light-emitting unit 60 and the light-emitting unit 70, to suppress the power consumption of the light-emitting unit portion 11.

According to the detecting device 3B of the third embodiment, even when suppressing the light luminescence amount of the light-emitting units 50, 60, and 70 to reduce the power consumption of the light-emitting unit portion 11, it is possible to receive light passing through the biological body by the light-receiving unit portion 12B with high accuracy, as described above. It is also possible for the detecting device 3B of the third embodiment to reduce cost by omitting a bandpass filter of the light-receiving unit 61. It is further possible for the detecting device 3B of the third embodiment to suppress an incidence of the stray light component SL1 on the light-receiving unit 51B without providing the angle-limiting filter 611, unlike the light-receiving unit 61.

It is further possible for the detecting device 3B of the third embodiment, where it is unnecessary as a countermeasure to the stray light to provide a light-shielding member between the light-receiving unit 51B and the light-receiving unit 61, to unnecessitate a space for providing the light-shielding member and to eventually miniaturize the device configuration by suppressing the detecting device 3B from growing in size.

First Modified Example

Next, the first modified example of a detecting device will be described. The first modified example is a modified example of the detecting device 3B of the third embodiment. In the following, configurations and members common to the third embodiment will be given identical reference signs and detailed description will be given omitting the reference signs.

Figure 14:
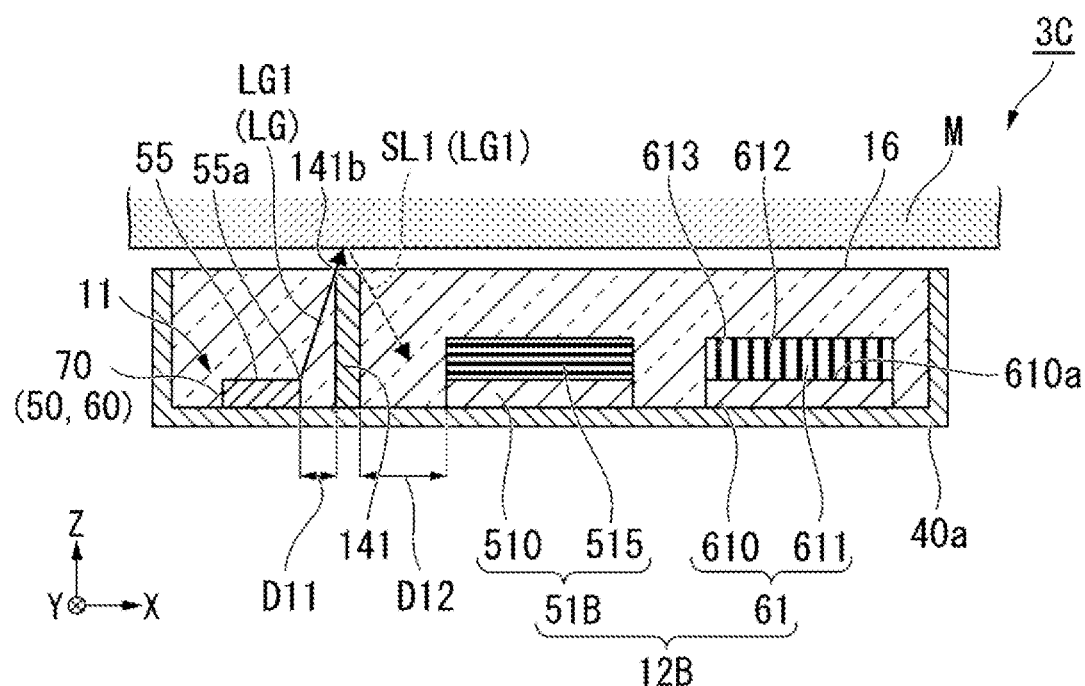
FIG. 14 is a cross-sectional view of a detecting device according to the first modified example.

FIG. 14 is a cross-sectional view of the detecting device of the first modified example.

A detecting device 3C of the first modified example includes the light-emitting unit portion 11, the light-receiving unit portion 12B, the case 40, a first light-shielding wall 141, and the sealing layer 42, as illustrated in FIG. 14. The leading end portion of the first light-shielding wall 141 of the first modified example is formed flush with the detection surface 16. That is, in the case of the first modified example, the leading end portion of the first light-shielding wall 141 does not protrude from the detection surface 16.

A distance D12 from the first light-shielding wall 141 to the light-receiving unit 51B is longer than a distance D11 from the first light-shielding wall 141 to the light-emitting unit 50, in the X direction. That is, the light-receiving unit 51B is disposed at a position farther away from the first light-shielding wall 141 than the light-emitting unit 50. Note that the light-emitting unit 60 and the light-emitting unit 70 are aligned side-by-side in a Y direction at the light-emitting unit 50.

Here, a consideration will be given to the pathway of the green light LG1 emitted from an end surface 55a on the side (the +X side) of the light-receiving unit 51B in a light-emission surface 55 of the light-emitting unit 50 and passing via an end portion 141b on the side of the light-emitting unit 50 of the first light-shielding wall 141, as illustrated in FIG. 14. Provided that the green light LG1 is specular reflected by a biological surface (the measurement site M), the green light LG1 reaches the position farthest away in the X direction from the first light-shielding wall 141.

Supposing that the distance D12 from the first light-shielding wall 141 to the light-receiving unit 51B is equal to the distance D11 from the first light-shielding wall 141 to the light-emitting unit 50, the green light LG1 described above will be incident, as the stray light component SL1, on the light-receiving unit 51B. In other words, when the light-receiving unit 51B and the light-emitting unit 50 are arranged equidistant on both sides of the first light-shielding wall 141, the stray light component SL1 will be incident on the light-receiving unit 51B.

In contrast, in the detecting device 3C of the first modified example, the light-receiving unit 51B is disposed farther from the first light-shielding wall 141 than the light-emitting unit 50, which makes it possible to suppress an incidence of the stray light component SL1 (the green light LG1) on the light-receiving surface 510a of the light-receiving element 510, as described above.

Thus, according to the detecting device 3C of the first modified example, a configuration is employed, in place of the first light-shielding wall 140 of the third embodiment, in which the distance D12 from the first light-shielding wall 141 to the light-receiving unit 51B is longer than the distance D11 from the first light-shielding wall 141 to the light-emitting unit 50, which makes it possible to suppress an incidence of the stray light component SL1 serving as a noise source on the light-receiving unit 51B without providing the angle-limiting filter 611, unlike the light-receiving unit 61. This makes it possible, as in the third embodiment, to suppress the luminescence amount of the green light LG in the light-emitting unit 50, and to thus suppress the power consumption of the light-emitting unit portion 11.

Second Modified Example

Next, the second modified example of a detecting device will be described. The second modified example is another modified example of the detecting device 3B of the third embodiment. In the following, configurations and members common to the third embodiment and the first modified example will be given identical reference signs and detailed description will be given omitting the reference signs.

Figure 15:
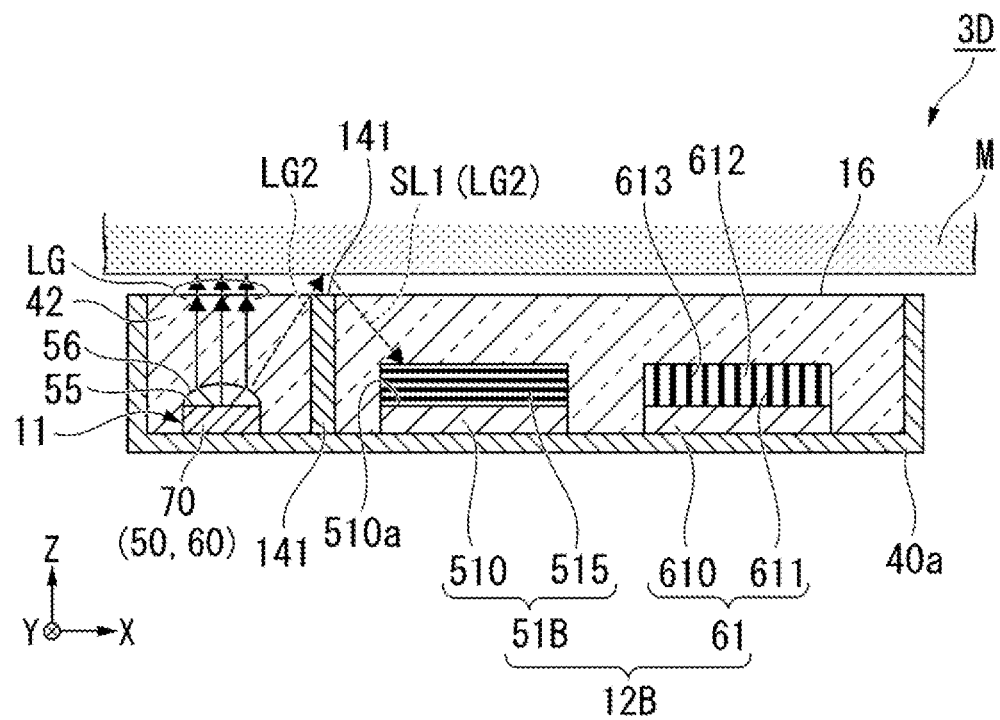
FIG. 15 is a cross-sectional view of a detecting device according to the second modified example.

FIG. 15 is a cross-sectional view of the detecting device of the second modified example.

A detecting device 3D of the second modified example includes the light-emitting unit portion 11, the light-receiving unit portion 12B, the case 40, the first light-shielding wall 141, and the sealing layer 42, as illustrated in FIG. 15. The leading end portion of the first light-shielding wall 141 is formed flush with the detection surface 16.

The light-emitting unit 50 of the second modified example includes a lens (optical element) 56 provided at the light-emission surface 55 and deflects a direction in which the green light LG is emitted, in the normal direction (the Z direction) of the light-emission surface 55. Note that the light-emitting unit 60 and the light-emitting unit 70 may be provided with a lens or may not be provided with a lens at a light-emission surface. Also, a diffractive element may be used, in place of the lens, as the optical element that deflects the green light LG.

A case where the lens 56 is not provided will now be described. In general, the green light LG is radially emitted from the light-emission surface 55 of the light-emitting unit 50. Thus, given that the lens 56 is not provided, there is a risk that the green light LG2, which is a part of the green light LG, may be reflected by a biological surface (the measurement site M) to thus enter the light-receiving unit 51B as the stray light component SL1 without passing through the biological body.

In contrast, in the light-emitting unit 50 of the second modified example, the green light LG is emitted by the lens 56 toward the normal line direction of the light-emission surface 55, thus the green light LG is vertically incident on the measurement site M. Accordingly, it is possible, by suppression of a reflection of the green light LG2 by the surface of the measurement site M, to suppress an incidence, as the stray light component SL1, of the green light LG2 reflected by the surface of the measurement site M on the light-receiving surface 510a of the light-receiving element 510.

Consequently, according to the detecting device 3D of the second modified example, it is possible, by providing the lens 56 in place of the first light-shielding wall 140 of the third embodiment at the light-emission surface 55 of the light-emitting unit 50, to suppress an incidence of the stray light component SL1 serving as a noise source on the light-receiving unit 51B without providing the lens 56 at the light-emission surface 55 of the light-emitting unit 50, unlike the light-receiving unit 61. This makes it possible, as in the third embodiment, to suppress, by suppression of the luminescence amount of the green light LG in the light-emitting unit 50, the power consumption of the light-emitting unit portion 11.

Fourth Embodiment

Next, a detecting device of the fourth embodiment will be described. In the third embodiment and the above-described modified examples, an example is given of a case where the light-receiving unit 61 includes the angle-limiting filter 611, and the detecting device of the fourth embodiment differs in that a light-receiving unit 261 does not include an angle-limiting filter. In the following, configurations and members common to the above-described embodiments and modified examples will be given identical reference signs and detailed description will be given omitting the reference signs.

Figure 16:
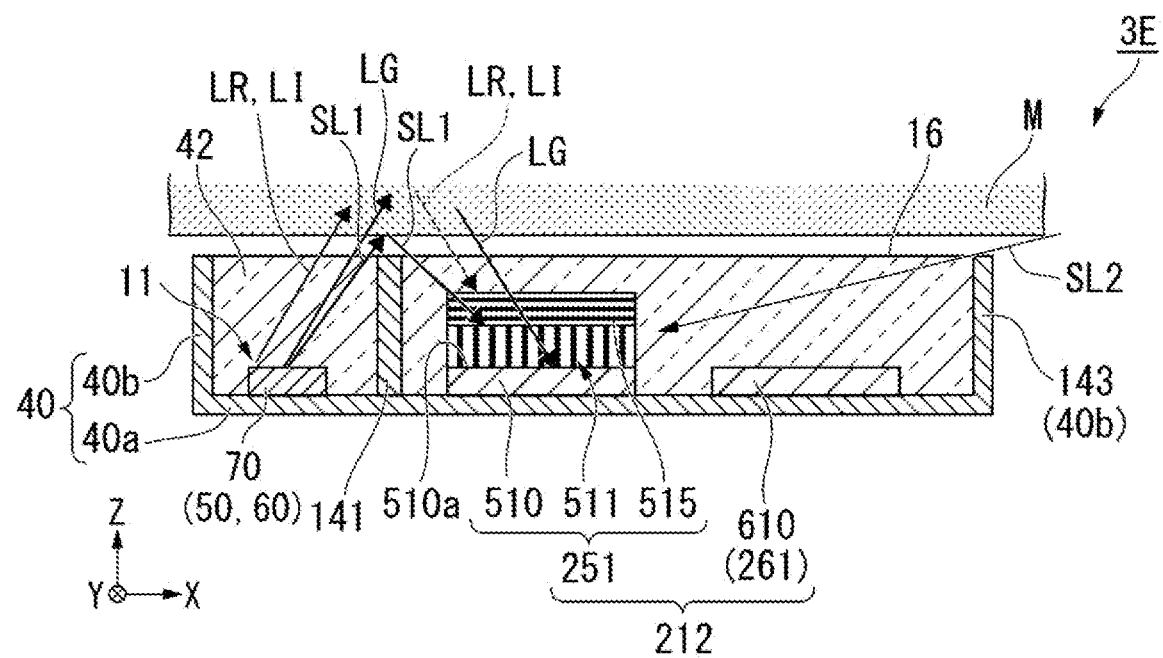
FIG. 16 is a cross-sectional view of a detecting device according to the fourth embodiment.

FIG. 16 is a cross-sectional view of a detecting device of the fourth embodiment.

A detecting device 3E of the fourth embodiment includes the light-emitting unit portion 11, a light-receiving unit portion 212, the case 40, the first light-shielding wall 141, the sealing layer 42, and a second light-shielding wall 143, as illustrated in FIG. 16. The leading end portion of the first light-shielding wall 141 is formed flush with the detection surface 16.

The light-receiving unit portion 212 of the fourth embodiment includes a light-receiving unit (first light-receiving unit) 251, and the light-receiving unit (second light-receiving unit) 261. In the following, when the light-receiving unit 251 and the light-receiving unit 261 are not particularly distinguished, these are collectively referred to as "light-receiving units 251 and 261".

The second light-shielding wall 143 is provided on an opposite side (the +X side) of the light-receiving unit 261 from the light-receiving unit 251. The second light-shielding wall 143 is a member having light-shielding properties for blocking light such as sunlight from directly entering the light-receiving unit portion 212 through the gap between the measurement site M and the detection surface 16, as described later. In the fourth embodiment, the second light-shielding wall 143 is constituted by a portion, of the side plate portion 40B constituting the case 40, located on an opposite side (the +X side) of the light-receiving unit 261 from the light-receiving unit 251. Note that the second light-shielding wall 143 may be constituted by a member separate from the side plate portion 40B of the case 40.

The light-receiving unit 251 includes the light-receiving element 510 that receives the green light LG, the angle-limiting filter 511, provided on the light-receiving element 510, that limits an incidence angle of the green light LG reaching the light-receiving element 510, and the bandpass filter 515, provided on the angle-limiting filter 511, that selectively transmits the green light LG.

The angle-limiting filter 511, which has the same configuration as the angle-limiting filter 611, can limit an incidence angle of the green light LG reaching the light-receiving element 510. The angle-limiting filter 511 transmits the green light LG entering at the permissible incidence angle by propagating in the biological body, and cuts off light incident at an angle greater than the permissible incidence angle, the light being external light such as sunlight or the green light LG that did not pass through the biological body, for example.

In contrast, the light-receiving unit 261 is constituted only by the light-receiving element 610 that receives the red light LR or the near-infrared light LI. That is, in the detecting device 3E of the fourth embodiment, the light-receiving unit 261 has a configuration different from that of the light-receiving unit 251 in that the light-receiving unit 261 does not include any of an angle-limiting filter and a bandpass filter.

A part of the green light LG emitted from the light-emitting unit 50 may be reflected by a biological surface (the measurement site M) or the like to thus directly enter the light-receiving unit 251 as a stray light component SL1 without passing through the biological body, as illustrated in FIG. 16. External light such as sunlight may also directly enter the light-receiving unit 251 through the gap between the biological body and the detection surface 16. In the following, the external light advancing toward the side of the light-receiving unit 251 without passing through the biological body is referred to as "stray light component SL2".

The stray light component SL1, which has a green wavelength band, enters, by passing through the bandpass filter 515, the angle-limiting filter 511 provided at the lower layer of the bandpass filter 515. The angle-limiting filter 511 has characteristics of transmitting light incident at an angle smaller than the permissible incidence angle, and cutting off light incident at an angle greater than the permissible incidence angle, as described above.

The stray light component SL1 enters the light-receiving unit 251 without passing through the biological body, thus the incidence angle of the green light LG with respect to the light-receiving unit 251 is greater than the permissible incidence angle of the angle-limiting filter 511. In other words, the stray light component SL1 is cut off by the angle-limiting filter 511. This makes it possible for the light-receiving unit 251 to suppress, by the angle-limiting filter 511, an incidence of the stray light component SL1 on the light-receiving surface 510a of the light-receiving element 510.

The stray light component SL2 is basically cut off by the bandpass filter 515, while a component having a green wavelength band contained in the stray light component SL2 passes through the bandpass filter 515. Here, the stray light component SL2 enters through the gap between the biological body and the detection surface 16, an incidence angle of the stray light component SL2 with respect to the light-receiving unit 51 is greater than the permissible incidence angle of the angle-limiting filter 511, as described above. Accordingly, a part (the component having a green wavelength band) of the stray light component SL2 transmitted through the bandpass filter 515 is cut off by the angle-limiting filter 511. This makes it possible for the light-receiving unit 251 to suppress, by the angle-limiting filter 511, an incidence of the stray light component SL2 on the light-receiving surface 510a of the light-receiving element 510.

As such, it is possible for the detecting device 3E of the fourth embodiment to prevent the stray light component SL1 and the stray light component SL2 from being incident on the light-receiving surface 510a of the light-receiving element 510. Accordingly, it is possible for the detecting device 3E of the fourth embodiment to receive the green light LG by the light-receiving unit 251 with higher accuracy.

In contrast, in the detecting device 3E of the fourth embodiment, the light-receiving unit 261 is disposed near the side plate portion 40B (the second light-shielding wall 143) of the case 40 compared to the light-receiving unit 251. Accordingly, there is also a risk that a part of the stray light component SL2 may directly enter the light-receiving unit 261 through the gap between the measurement site M and the detection surface 16.

In the detecting device 3E of the fourth embodiment, external light such as sunlight is suppressed from being incident, as a stray light component, on the light-receiving unit 261 by satisfying design conditions described later.

Figure 17:
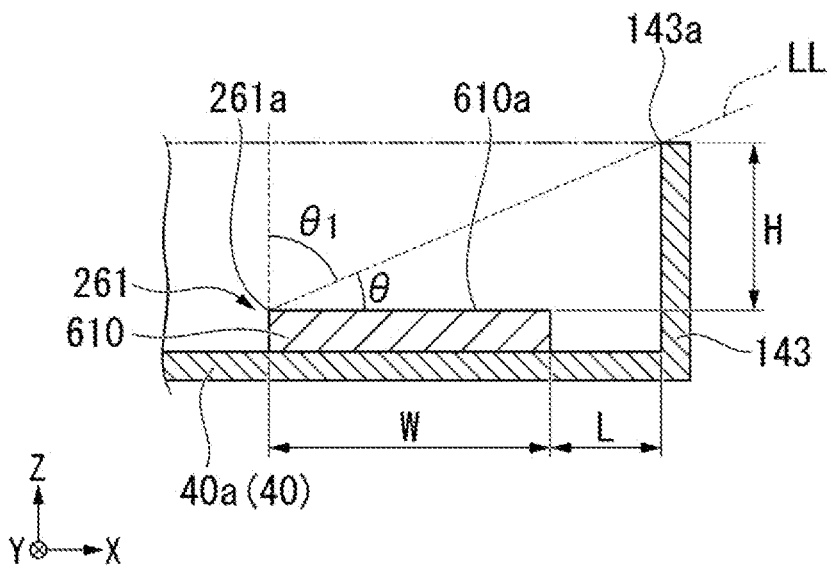
FIG. 17 is a diagram indicating a condition when a stray light component is incident on a light-receiving unit.

FIG. 17 is a diagram indicating a condition when the stray light component SL2 is incident on the light-receiving unit 261.

In FIG. 17, the height from the light-receiving surface 610a of the light-receiving unit 261 (the light-receiving element 610) to the leading end of the second light-shielding wall 143 is designated as H, the width of the light-receiving unit 261 in the X direction in which the light-receiving unit 251 and the light-receiving unit 261 are aligned is designated as W, the angle formed by an imaginary line LL connecting an end portion 261a, on the side of the light-receiving unit 251, of the light-receiving surface 610a of the light-receiving unit 261 and an upper end surface 143a, on the side of the light-receiving unit 261, of the second light-shielding wall 143, and the light-receiving surface 610a of the light-receiving unit 261 is designated as 8. Also, the gap between the light-receiving unit 261 and the second light-shielding wall 143 is designated as L.

When a part of the stray light component SL2 that can barely enter the light-receiving surface 610a of the light-receiving unit 261 provided with a gap L created between the light-receiving surface 610a and the second light-shielding wall 143 is referred to as critical component, the critical component is incident, along the imaginary line LL, on the light-receiving surface 610a at an angle θ, as illustrated in FIG. 17.

When the position of the light-receiving unit 261 is shifted to the +X side in FIG. 17, the critical component of the stray light component SL2 is inhibited from being incident on the light-receiving surface 610a of the light-receiving unit 261. In view of the above, the inventors, in the detecting device 3E of the fourth embodiment illustrated in FIG. 16, set the gap L between the light-receiving unit 261 and the second light-shielding wall 143 to a value satisfying the following formula.

$$L < H/\tan \theta - W \qquad \text{[Formula 1]}$$

Note that, in FIG. 17, given that an incidence angle 61, with respect to the normal line of the light-receiving surface 610a, of the imaginary line LL through which the critical component passes is defined as an angle with respect to the normal line of the light-receiving surface 610a, the angle is defined by the following formula.

$$\theta_1 = 90 - \arctan\left(\frac{H}{W+L}\right) \qquad \text{[Formula 2]}$$

According to the detecting device 3E of the fourth embodiment, the light-receiving surface 610a of the light-receiving unit 261 (the light-receiving element 610) is shifted to the +X side from the state illustrated in FIG. 17, which makes it possible to suppress an incidence of the stray light component SL2 on the light-receiving unit 261. According to the detecting device 3E of the fourth embodiment, it is possible, without providing the angle-limiting filter 511 such as the light-receiving unit 251, to suppress an incidence of the stray light component SL2 on the light-receiving unit 261.

In the case of the fourth embodiment, the green light LG is attenuated and only the red light LR and the near-infrared light LI are incident on the light-receiving unit 261, thus it is unnecessary to provide, at the light-receiving unit 261, a bandpass filter configured to selectively transmit the red light LR and the near-infrared light LI and cut off the green light LG. It is also possible, by optimizing the position of the light-receiving unit 261 with respect to the second light-shielding wall 143, to suppress an incidence of a stray light component on the light-receiving unit 261 without using an angle-limiting filter, as described above.

Thus, according to the detecting device 3E of the fourth embodiment, it is possible to employ the above-described configuration in which only the light-receiving unit 251 includes the angle-limiting filter 511 and the bandpass filter 515, and the light-receiving unit 261 does not include any of the angle-limiting filter and the bandpass filter. Consequently, it is possible for the detecting device 3E of the fourth embodiment to reduce cost by omitting an angle-limiting filter and an bandpass filter of the light-receiving unit 261.

Fifth Embodiment

Next, a detecting device of the fifth embodiment will be described. In the third embodiment, the first modified example, the second modified example, and the fourth embodiment, an example is given of a case of using a light-receiving unit that receives both the red light LR and the near-infrared light LI, and the detecting device of the fifth embodiment differs from the third embodiment in that a light-receiving unit that individually receives the red light LR and the near-infrared light LI is provided.

Figure 18:
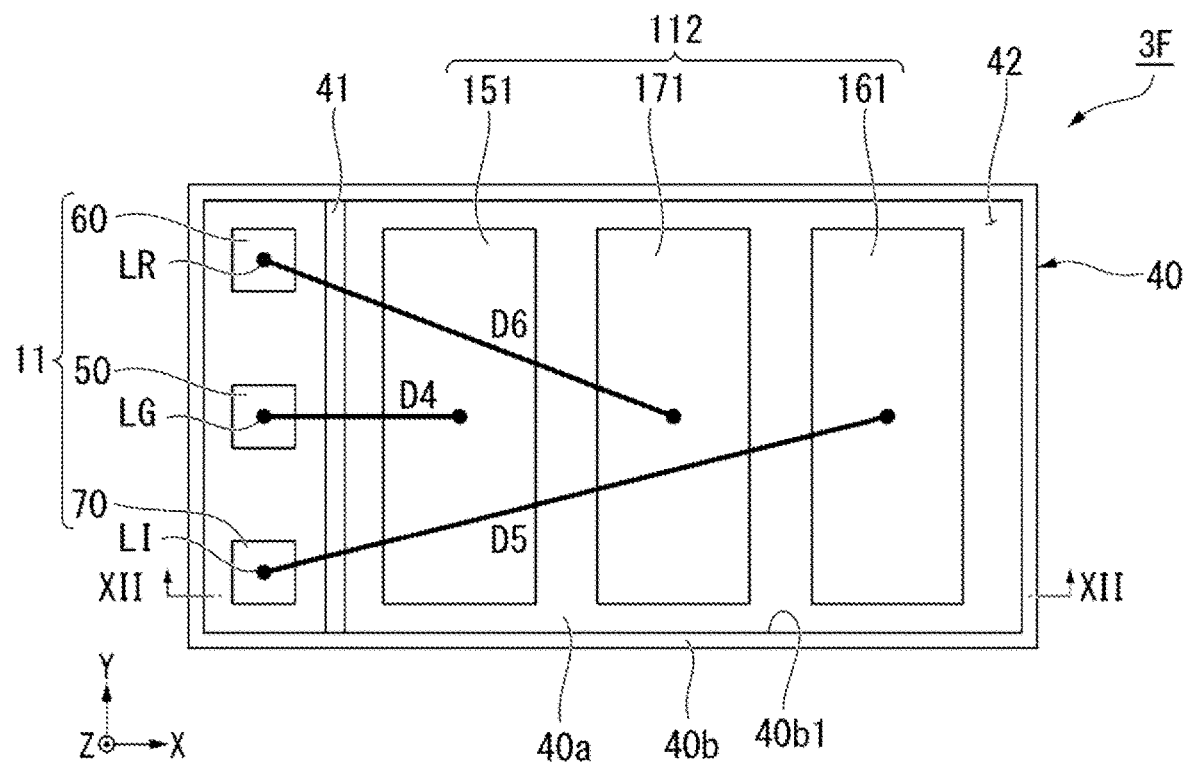
FIG. 18 is a plan view of a detecting device of the fifth embodiment.
Figure 19:
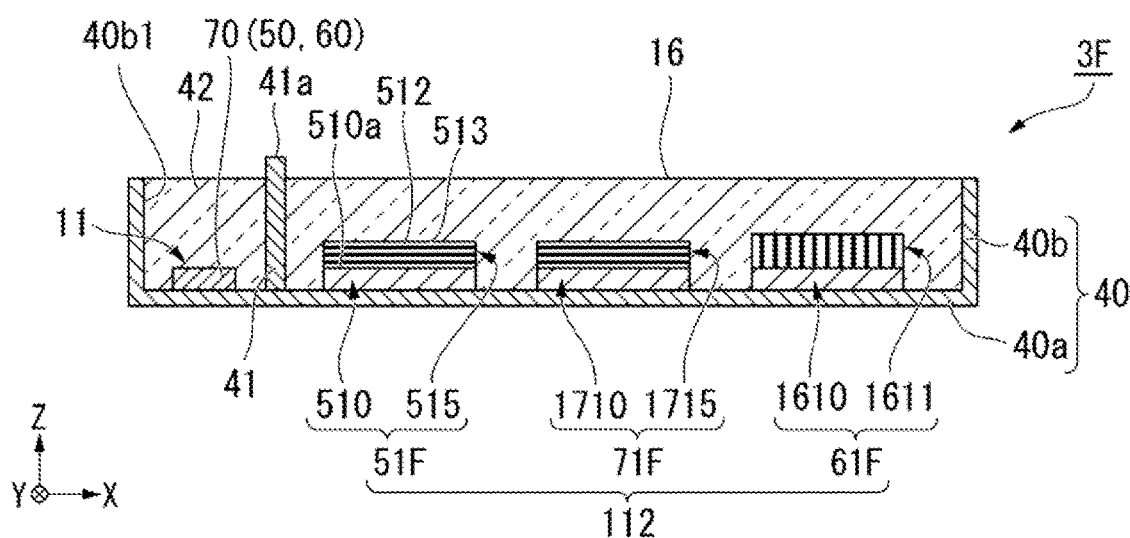
FIG. 19 is a cross-sectional view taken along a line XII-XII in FIG. 18.

FIG. 18 is a plan view of a detecting device of the fifth embodiment. FIG. 19 is a cross-sectional view taken along the line XII-XII in FIG. 18. Note that common configurations and members as in the third embodiment are given identical reference signs and detailed description will be omitted.

The light-receiving unit portion 112 in a detecting device 3F of the fifth embodiment includes a light-receiving unit (first light-receiving unit) 51F, a light-receiving unit (second light-receiving unit) 61F, and a light-receiving unit (third light-receiving unit) 71F, as illustrated in FIGS. 18 and 19. In the detecting device 3F of the fifth embodiment as well, the leading end portion 41a of the first light-shielding wall 140 protrudes more than the detection surface 16, as illustrated in FIG. 19.

The light-receiving unit 51F receives the green light LG emitted from the light-emitting unit 50 and propagated inside the measurement site M, and generates a detection signal depending on the intensity of the received light.

The light-receiving unit 61F receives the near-infrared light LI emitted from the light-emitting unit 70 and propagated inside the measurement site M, and generates a detection signal depending on the intensity of the received light.

The light-receiving unit 71F receives the red light LR emitted from the light-emitting unit 60 and propagated inside the measurement site M, and generates a detection signal depending on the intensity of the received light.

That is, in the fifth embodiment, the light-emitting unit 50 corresponds to the "first light-emitting unit", and the green light LG emitted from the light-emitting unit 50 corresponds to the "first light". In addition, the light-emitting unit 70 corresponds to the "second light-emitting unit", and the near-infrared light LI emitted from the light-emitting unit 70 corresponds to the "second light". Further, the light-emitting unit 60 corresponds to the "third light-emitting unit", and the red light LR emitted from the light-emitting unit 60 corresponds to the "third light".

The detecting device 3F of the fifth embodiment differs from the detecting device 3B of the third embodiment in that the red light LR and the near-infrared light LI are individually received by two light-receiving units (the light-receiving unit 71F and the light-receiving unit 61F).

The light-receiving unit portion 112 is installed inside the case 40 such that the light-receiving surfaces of the light-receiving units 51F, 71F, and 61F are parallel to the XY plane. Specifically, the light-receiving unit 51F is disposed on the +X side of the light-emitting unit portion 11, the light-receiving unit 71F is disposed on the +X side of the light-receiving unit 51F, and the light-receiving unit 61F is disposed on the +X side of the light-receiving unit 71F. That is, the light-receiving unit 71F is disposed between the light-receiving unit 51F and the light-receiving unit 61F.

In the fifth embodiment, the distance from the light-emitting unit 50 to the light-receiving unit 51F is designated as D4. The distance D4 corresponds to the distance between the center portions of the light-emitting unit 50 and the light-receiving unit 51F when these are viewed in plan view from the Z axis direction.

Also, the distance from the light-emitting unit 70 to the light-receiving unit 61F is designated as D5. The distance D5 corresponds to the distance between the center portions of the light-emitting unit 70 and the light-receiving unit 61F when these are viewed in plan view from the Z axis direction.

Also, the distance from the light-emitting unit 60 to the light-receiving unit 71F is designated as D6. The distance D6 corresponds to the distance between the center portions of the light-emitting unit 60 and the light-receiving unit 71F when these are viewed in plan view from the Z axis direction.

In the detecting device 3F of the fifth embodiment, the distance D4 from the light-emitting unit 50 to the light-receiving unit 51F is shorter than the distance D5 from the light-emitting unit 70 to the light-receiving unit 61F. Also, the distance D4 from the light-emitting unit 50 to the light-receiving unit 51F is shorter than the distance D6 from the light-emitting unit 60 to the light-receiving unit 71F. Note that the distance D6 is shorter than the distance D5.

The detecting device 3F of the fifth embodiment also employs a configuration in which the light-receiving unit 51F for receiving the green light LG is disposed at the position closest to the light-emitting unit 50 that emits the green light LG.

The light-receiving unit 51F has the same configuration as the light-receiving unit 51B of the third embodiment. That is, the light-receiving unit 51F includes the light-receiving element 510 that receives the green light LG, and the bandpass filter 515.

In the detecting device 3F of the fifth embodiment, the light-receiving unit 61F that receives the near-infrared light LI is disposed at the position farthest away from the light-emitting unit portion 11. The light-receiving unit 61F has the same configuration as the light-receiving unit 61 of the third embodiment. The light-receiving unit 61F includes the light-receiving element 1610 that receives the near-infrared light LI, and the angle-limiting filter 1611 that limits an incidence angle of the near-infrared light LI reaching the light-receiving element 1610.

The green light LG can only propagate a short distance in the biological body compared to the red light LR or the near-infrared light LI. Accordingly, the green light LG never reaches the light-receiving unit 61F. Also, the red light LR propagates a shorter distance in the biological body than the near-infrared light LI, as illustrated in FIG. 12. Accordingly, the red light LR is in a state of sufficiently attenuated in the biological body until reaching the light-receiving unit 61F, and thus a small light amount of the red light LR is incident on the light-receiving unit 161. Thus, according to the detecting device 3F of the fifth embodiment, it is possible, in the light-receiving unit 61F, to omit a bandpass filter that selectively transmits the near-infrared light LI. Consequently, it is possible for the detecting device 3F of the fifth embodiment to reduce cost by omitting a bandpass filter of the light-receiving unit 61F.

The light-receiving unit 71F has the same configuration as the light-receiving unit 51F. That is, the light-receiving unit 71F includes the light-receiving element 1710 that receives the red light LR, and the bandpass filter 1715 that selectively transmits the red light LR. The bandpass filter 1715 has characteristics of selectively transmitting a wavelength band of the red light LR, and absorbing and cutting off the green light LG and the near-infrared light LI. Note that, in the fifth embodiment, an angle-limiting filter that limits an incidence angle of the red light LR reaching the light-receiving element 1710 may be provided at the light-receiving unit 71F.

In the detecting device 3F of the fifth embodiment, the distance (the distance D6) between the light-emitting unit 60 that emits the red light LR and the light-receiving unit 71F that receives the red light LR is shorter than the distance (the distance D5) between the light-emitting unit 70 that emits the near-infrared light LI and the light-receiving unit 61F that receives the near-infrared light LI. Accordingly, the green light LG propagated in the biological body may enter the light-receiving unit 71F in a state of not sufficiently attenuated.

It is also possible for the near-infrared light LI to propagate a longer distance in the biological body than the green light LG, thus there is a risk that the near-infrared light LI may enter the light-receiving unit 71F with a higher intensity than the green light LG. In contrast, in the case of the fifth embodiment, it is possible for the light-receiving unit 71F including the bandpass filter 1715 to cause the red light LR to be efficiently incident on the light-receiving element 1710.

According to the detecting device 3F of the fifth embodiment, the leading end portion 41a of the first light-shielding wall 140 protrudes more than the detection surface 16, thereby preventing a stray light component from being incident on the light-receiving unit 51F, and causing the green light LG emitted from the light-emitting unit portion 11 and passing through the biological body to be efficiently incident on the light-receiving unit 51F.

Also, according to the detecting device 3F of the fifth embodiment, the leading end portion 41a of the first light-shielding wall 140 protrudes more than the detection surface 16, thereby preventing a stray light component from being incident on the light-receiving unit 71F, and causing the red light LR emitted from the light-emitting unit portion 11 and passing through the biological body to be efficiently incident on the light-receiving unit 71F. It is also possible, by providing the angle-limiting filter 1611, to prevent a stray light component from being incident on the light-receiving unit 61F, and cause the near-infrared light LI emitted from the light-emitting unit portion 11 and passing through the biological body to be efficiently incident on the light-receiving unit 61F.

According to the detecting device 3F of the fifth embodiment, it is possible to efficiently receive light by the light-receiving units 51F, 61F, and 71F, which makes it possible, by suppression of the luminescence amount of the light-emitting unit 50, 60, and 70, to suppress the power consumption of the light-emitting unit portion 11, as described above. Also, according to the detecting device 3F of the fifth embodiment, a light-shielding member having a thickness becomes unnecessary as a countermeasure for the stray light, which makes it possible to miniaturize the device configuration.

Thus far, the present disclosure has been described based on the above-described embodiments, however, the present disclosure is not limited to the above-described embodiments, and can be embodied in various aspects without departing from the spirit and scope of the present disclosure.

In the above-described embodiments, although a human is exemplified as the biological body, the present disclosure is also applicable to a measurement of biometric information (for example, a pulse rate) of other animals, for example.

In addition, in the measuring devices 100 and 100B of the above-described embodiments, an example is given of a case where the detecting devices 3 and 3B are provided inside the housing portion 1, however, the installation locations of the detecting devices 3 and 3B are not limited to this, and the detecting devices 3 and 3B may be embedded inside the belt 2, for example.

Further, a wristwatch type configuration is exemplified as the example of the measuring devices 100 and 100B of the above-described embodiments, however, the present disclosure may also be applied to a configuration in which the measuring devices 100 and 100B are mounted on the neck of the examinee as a necklace type, a configuration in which the measuring devices 100 and 100B are mounted affixed to the body of the examinee as a seal type, and a configuration in which the measuring device is mounted on the head of the examinee as a head-mounted display type, for example.

Further, in the detecting devices 3 and 3B of the above-described first embodiment, an example is given of a case where each of the light-emitting units 50, 60, and 70 is caused to emit light in a time division manner, however, the light-emitting unit 50 may be made to light up constantly rather than the time division because the light-receiving unit 61 corresponding to the green light LG from the light-emitting unit 50 is individually provided.

The configuration of the first modified example or the second modified example may also be applied to the detecting device 3F of the fifth embodiment. The configuration of the fifth embodiment may further be applied to the detecting device 3E of the fourth embodiment. That is, the detecting device 3E of the fourth embodiment may be provided with a light-receiving unit that individually receives the red light LR and the near-infrared light LI.

In the detecting device 3B of the third embodiment, the angle-limiting filter 611 of the light-receiving unit 61 may also be omitted. Provided that the configuration of the fourth embodiment is applied in this case, it is possible to suppress an incidence of a stray light component on the light-receiving unit 61 without providing the angle-limiting filter 611.

A detecting device of one aspect of the present disclosure may have the following configuration.

A detecting device of one aspect of the present disclosure, the detecting device including a first light-emitting unit that emits first light having a green wavelength band, a second light-emitting unit that emits second light having a wavelength band higher than the wavelength band of the green wavelength band, a first light-receiving unit that receives the first light emitted from the first light-emitting unit and emitted from a biological body, and a second light-receiving unit that receives second light emitted from the second light-emitting unit and emitted from the biological body, in which the first light-receiving unit includes a bandpass filter that selectively transmits the first light, and a distance from the first light-emitting unit to the first light-receiving unit is shorter than a distance from the second light-emitting unit to the second light-receiving unit.

In the detecting device of one aspect of the present disclosure, the first light-receiving unit may include the bandpass filter that selectively transmits the first light, and the second light-receiving unit may not include a bandpass filter that selectively transmits the second light.

In the detecting device of one aspect of the present disclosure, the first light-receiving unit may include a first sensor unit that receives the first light and a first angle-limiting filter that limits an incidence angle of the first light reaching the first sensor unit, and the second light-receiving unit may include a second sensor unit that receives the second light and a second angle-limiting filter that limits an incidence angle of the second light reaching the second sensor unit.

In the detecting device of one aspect of the present disclosure may further include a light-shielding wall provided between the first light-emitting unit and the second light-emitting unit, and the first light-receiving unit, the light-shielding wall being configured to block a part of the first light and the second light.

The detecting device of one aspect of the present disclosure may include a first light-emitting unit that emits first light having a green wavelength band, a second light-emitting unit that emits second light having a wavelength band higher than the wavelength band of the green wavelength band, a first light-receiving unit that receives the first light emitted form the first light-emitting unit and emitted from a biological body, a second light-receiving unit that receives the second light emitted form the second light-emitting unit and emitted from the biological body, and a bandpass filter provided on a light-receiving element of the first light-receiving unit, the bandpass filter being configured to selectively transmit the first light, in which a distance from the first light-emitting unit to the first light-receiving unit may be shorter than a distance from the second light-emitting unit to the second light-receiving unit.

The detecting device of one aspect of the present disclosure may further include a first light-shielding wall provided between the first light-emitting unit and the second light-emitting unit, and the first light-receiving unit, the first light-shielding wall being configured to block a part of the first light and the second light.

The detecting device of one aspect of the present disclosure may further include a sealing layer that seals the first light-emitting unit and the second light-emitting unit, and the first light-receiving unit and the second light-receiving unit, in which a leading end portion of the first light-shielding wall may protrude from the sealing layer.

In the detecting device of one aspect of the present disclosure, a distance from the first light-shielding wall to the first light-receiving unit may be longer than a distance from the first light-shielding wall to the first light-emitting unit.

In the detecting device of one aspect of the present disclosure, the first light-emitting unit may be provided at a light-emission surface, the first light-emitting unit including an optical element that deflects a direction in which the first light is emitted, in a normal direction of the light-emission surface.

A detecting device of another aspect of the present disclosure, the detecting device including a first light-emitting unit that emits first light having a green wavelength band, a second light-emitting unit that emits second light having a wavelength band higher than the wavelength band of the green wavelength band, a first light-receiving unit that receives the first light emitted from the first light-emitting unit and emitted from a biological body, a second light-receiving unit that receives second light emitted from the second light-emitting unit and emitted from the biological body, an angle-limiting filter provided on a light-receiving element of the first light-receiving unit, the angle-limiting filter being configured to limit an incidence angle of the first light reaching the first light-receiving unit, and a bandpass filter provided on the angle-limiting filter, the bandpass filter being configured to selectively transmit the first light, in which a distance from the first light-emitting unit to the first light-receiving unit is shorter than a distance from the second light-emitting unit to the second light-receiving unit, the second light-receiving unit being devoid of an angle-limiting filter that limits an incidence angle of the second light reaching the second light-receiving unit, and a bandpass filter that selectively transmits the second light.

In the detecting device of another aspect of the present disclosure, the detecting device may further include a second light-shielding wall provided on an opposite side of the second light-receiving unit from the first light-receiving unit.

In the detecting device of another aspect of the present disclosure, given that a height from a light-receiving surface of the second light-receiving unit to a leading end of the second light-shielding wall may be designated as H, a width of the second light-receiving unit in a direction in which the first light-receiving unit and the second light-receiving unit are aligned may be designated as W, and an angle formed by an imaginary line connecting an end portion, on a side of the first light-receiving unit, of the light-receiving surface of the second light-receiving unit and an upper end surface, on a side of the second light-receiving unit, of the second light-shielding wall, and the light-receiving surface of the second light-receiving unit is designated as θ, a gap L between the second light-receiving unit and the second light-shielding wall may be set to a value satisfying a following formula.

$$L < H/\tan \theta - W \qquad \text{[Formula 3]}$$

In the detecting device of another aspect of the present disclosure, the first light-emitting unit and the second light-emitting unit may be aligned side-by-side in a first direction, and the first light-receiving unit and the second light-receiving unit may be aligned side-by-side in a second direction intersecting the first direction.

The detecting device of another aspect of the present disclosure may further include a third light-emitting unit that emits third light, in which the second light-emitting unit may emit light, as the second light, in one wavelength band of a red wavelength band or a near-infrared wavelength band, the third light-emitting unit may emit light, as the third light, in another wavelength band of the red wavelength band or the near-infrared wavelength band, the second light-receiving unit may receive the third light emitted from the third light-emitting unit and emitted from the biological body, and the second light, and the distance from the first light-emitting unit to the first light-receiving unit may be shorter than a distance from the third light-emitting unit to the second light-receiving unit.

The detecting device of another aspect of the present disclosure may further include a third light-emitting unit that emits third light, and a third light-receiving unit that receives the third light emitted from the third light-emitting unit and emitted from the biological body, in which the second light-emitting unit may emit light, as the second light, in one wavelength band of a red wavelength band or a near-infrared wavelength band, the third light-emitting unit may emit light, as the third light, in another wavelength band of the red wavelength band and the near infrared wavelength band, and the distance from the first light-emitting unit to the first light-receiving unit may be shorter than a distance from the third light-emitting unit to the third light-receiving unit.

In the detecting device of another aspect of the present disclosure, the first light-emitting unit may be disposed, in the first direction, between the second light-emitting unit and the third light-emitting unit.

A measuring device of one aspect of the present disclosure may have the following configuration.

The measuring device of one aspect of the present disclosure includes the detecting device according to the aspects described above, and an information analysis unit that determines biometric information from a detection signal indicating a detection result of the detecting device.

What is claimed is:

1. A detecting device, comprising:
    a first light-emitting unit that emits first light having a green wavelength band;
    a second light-emitting unit that emits second light having a wavelength band higher than the wavelength band of the green wavelength band;
    a first light-receiving unit that receives the first light emitted from the first light-emitting unit after propagating through biological body;
    a second light-receiving unit that receives the second light emitted from the second light-emitting unit after propagating through the biological body;
    a detection surface that is configured to contact a surface of the biological body; and
    a first light-shielding wall provided between (i) the first light-emitting unit and the second light-emitting unit and (ii) the first light-receiving unit, the first light-shielding wall being configured to block a part of the first light and the second light, wherein
    the first light-receiving unit includes a bandpass filter that selectively transmits the first light,
    a distance from the first light-emitting unit to the first light-receiving unit is shorter than a distance from the second light-emitting unit to the second light-receiving unit, and
    a leading end portion of the first light-shielding wall protrudes from the detection surface.

2. The detecting device according to claim 1, wherein
    the first light-receiving unit includes the bandpass filter that selectively transmits the first light, and
    the second light-receiving unit does not include a bandpass filter that selectively transmits the second light.

3. The detecting device according to claim 1, wherein
    the first light-receiving unit includes a first sensor unit that receives the first light and a first angle-limiting filter that limits an incidence angle of the first light reaching the first sensor unit, and
    the second light-receiving unit includes a second sensor unit that receives the second light and a second angle-limiting filter that limits an incidence angle of the second light reaching the second sensor unit.

4. The detecting device according to claim 1, wherein there is no light shielding wall provided between the first light receiving unit and the second light receiving unit.

5. A detecting device, comprising:
    a first light-emitting unit that emits first light having a green wavelength band;
    a second light-emitting unit that emits second light having a wavelength band higher than the wavelength band of the green wavelength band;
    a first light-receiving unit that receives the first light emitted from the first light-emitting unit after propagating through a biological body;
    a second light-receiving unit that receives the second light emitted from the second light-emitting unit after propagating through the biological body;
    a detection surface that is configured to contact a surface of the biological body;
    a first light-shielding wall provided between (i) the first light-emitting unit and the second light-emitting unit and (ii) the first light-receiving unit, the first light-shielding wall being configured to block a part of the first light and the second light; and
    a bandpass filter provided at a light-receiving element of the first light-receiving unit, the bandpass filter being configured to selectively transmit the first light, wherein
    a distance from the first light-emitting unit to the first light-receiving unit is shorter than a distance from the second light-emitting unit to the second light-receiving unit, and
    a leading end portion of the first light-shielding wall protrudes from the detection surface.

6. The detecting device according to claim 5, wherein there is no light shielding wall provided between the first light receiving unit and the second light receiving unit.

7. The detecting device according to claim 1, further comprising
    a sealing layer that seals the first light-emitting unit and the second light-emitting unit, and the first light-receiving unit and the second light-receiving unit, wherein
    the leading end portion of the first light-shielding wall protrudes from the sealing layer.

8. The detecting device according to claim 1, wherein
    a distance from the first light-shielding wall to the first light-receiving unit is longer than a distance from the first light-shielding wall to the first light-emitting unit.

9. The detecting device according to claim 5, wherein
    the first light-emitting unit is provided at a light-emission surface, the first light-emitting unit including an optical element that deflects a direction in which the first light is emitted, in a normal direction of the light-emission surface.

10. A detecting device, comprising:
    a first light-emitting unit that emits first light having a green wavelength band,
    a second light-emitting unit that emits second light having a wavelength band higher than the wavelength band of the green wavelength band,
    a first light-receiving unit that receives the first light emitted from the first light-emitting unit after propagating through biological body,
    a second light-receiving unit that receives second light emitted from the second light-emitting unit after propagating through the biological body,
    a detection surface that is configured to contact a surface of the biological body,
    a first light-shielding wall provided between (i) the first light-emitting unit and the second light-emitting unit and (ii) the first light-receiving unit, the first light-shielding wall being configured to block a part of the first light and the second light,
    an angle-limiting filter provided at a light-receiving element of the first light-receiving unit, the angle-limiting filter being configured to limit an incidence angle of the first light reaching the first light-receiving unit, and a bandpass filter provided at the angle-limiting filter, the bandpass filter being configured to selectively transmit the first light, wherein a distance from the first light-emitting unit to the first light-receiving unit is shorter than a distance from the second light-emitting unit to the second light-receiving unit, the second light-receiving unit being devoid of an angle-limiting filter that limits an incidence angle of the second light reaching the second light-receiving unit and a bandpass filter that selectively transmits the second light, and a leading end portion of the first light-shielding wall protrudes from the detection surface.

11. The detecting device according to claim 5, further comprising a second light-shielding wall provided on an opposite side of the second light-receiving unit from the first light-receiving unit.

12. The detecting device according to claim 11, wherein a gap L between the second light-receiving unit and the second light-shielding wall is set to a value satisfying a following formula:

$$L < H/\tan\theta - W \qquad \text{[Formula 1]}$$

where a height from a light-receiving surface of the second light-receiving unit to a leading end of the second light-shielding wall is H, a width of the second light-receiving unit in a direction in which the first light-receiving unit and the second light-receiving unit are aligned is W, and an angle formed by an imaginary line connecting an end portion, on a side of the first light-receiving unit, of the light-receiving surface of the second light-receiving unit and an upper end surface, on a side of the second light-receiving unit, of the second light-shielding wall, and the light-receiving surface of the second light-receiving unit is θ.

13. The detecting device according to claim 1, wherein the first light-emitting unit and the second light-emitting unit are aligned side-by-side in a first direction, and the first light-receiving unit and the second light-receiving unit are aligned side-by-side in a second direction intersecting the first direction.

14. The detecting device according to claim 1, further comprising a third light-emitting unit that emits third light, wherein the second light-emitting unit emits, as the second light, light in one wavelength band of a red wavelength band or a near-infrared wavelength band, the third light-emitting unit emits, as the third light, light in another wavelength band of the red wavelength band or the near-infrared wavelength band, the second light-receiving unit receives the third light emitted from the third light-emitting unit after propagating through the biological body, and the second light, and the distance from the first light-emitting unit to the first light-receiving unit is shorter than a distance from the third light-emitting unit to the second light-receiving unit.

15. The detecting device according to claim 1, further comprising a third light-emitting unit that emits third light, and a third light-receiving unit that receives the third light emitted from the third light-emitting unit after propagating through the biological body, wherein the second light-emitting unit emits, as the second light, light in one wavelength band of a red wavelength band or a near-infrared wavelength band, the third light-emitting unit emits, as the third light, light in another wavelength band of the red wavelength band and the near infrared wavelength band, and the distance from the first light-emitting unit to the first light-receiving unit is shorter than a distance from the third light-emitting unit to the third light-receiving unit.

16. The detecting device according to claim 5, wherein the first light-emitting unit is disposed, in a first direction, between the second light-emitting unit and the third light-emitting unit, and the first light-receiving unit and the second light-receiving unit are aligned side-by-side in a second direction intersecting the first direction.

17. A measuring device, comprising the detecting device according to claim 1, and an information analysis unit that determines biometric information from a detection signal indicating a detection result of the detecting device.

18. The detecting device according to claim 1, further comprising a third light-emitting unit that emits third light having a wavelength band higher than the wavelength band of the second light, wherein among (i) a distance between a center of the first light-emitting unit to a center of the first light-receiving unit, (ii) a distance between a center of the second light-emitting unit to a center of the first light-receiving unit, and (iii) a distance between a center of the third light-emitting unit to a center of the first light-receiving unit, the distance between the center of the first light-emitting unit to the center of the first light-receiving unit is the shortest.

* * * * *